(12) United States Patent
Shkoury et al.

(10) Patent No.: US 12,267,039 B2
(45) Date of Patent: Apr. 1, 2025

(54) METHOD AND APPARATUS FOR MELTING SNOW

(71) Applicant: Solaredge Technologies Ltd., Herzeliya (IL)

(72) Inventors: Roy Shkoury, Rehovot (IL); Gideon Eitan, Haifa (IL)

(73) Assignee: Solaredge Technologies Ltd., Herzeliya (IL)

( * ) Notice: Subject to any disclaimer, the term of this patent is extended or adjusted under 35 U.S.C. 154(b) by 0 days.

(21) Appl. No.: 18/334,488

(22) Filed: Jun. 14, 2023

(65) Prior Publication Data

US 2023/0336117 A1 Oct. 19, 2023

Related U.S. Application Data

(63) Continuation of application No. 17/069,988, filed on Oct. 14, 2020, now Pat. No. 11,716,052.

(60) Provisional application No. 62/915,161, filed on Oct. 15, 2019.

(51) Int. Cl.
*H02S 40/12* (2014.01)
*H02S 40/32* (2014.01)

(52) U.S. Cl.
CPC ............. *H02S 40/12* (2014.12); *H02S 40/32* (2014.12)

(58) Field of Classification Search
CPC .......... H02S 40/40; H02S 40/44; H02S 40/12; H02S 40/42; H02S 40/32; H02S 40/34; F24S 40/20; F24S 40/70; H01L 31/044
See application file for complete search history.

(56) References Cited

U.S. PATENT DOCUMENTS

| | | |
|---|---|---|
| 4,378,908 A | 4/1983 | Wood |
| 6,093,885 A | 7/2000 | Takehara et al. |
| 8,667,452 B2 | 3/2014 | Verghese et al. |
| 8,937,822 B2 | 1/2015 | Dent |
| 9,035,499 B2 | 5/2015 | Kesler et al. |
| 9,136,732 B2 | 9/2015 | Wolter |
| 9,263,968 B2 | 2/2016 | Potts et al. |
| 9,318,257 B2 | 4/2016 | Lou et al. |
| 10,236,690 B2 | 3/2019 | Judkins et al. |
| 2010/0043870 A1 | 2/2010 | Bennett et al. |
| 2010/0275968 A1 | 11/2010 | Kaiser et al. |
| 2011/0048502 A1 | 3/2011 | Kikinis et al. |
| 2011/0056924 A1 | 3/2011 | Townsend |
| 2011/0151609 A1 | 6/2011 | Chiang |
| 2011/0174365 A1 | 7/2011 | Drake et al. |
| 2011/0291479 A1 | 12/2011 | Lee |
| 2012/0060902 A1 | 3/2012 | Drake |

(Continued)

FOREIGN PATENT DOCUMENTS

| | | |
|---|---|---|
| CA | 2695754 A1 | 9/2011 |
| CN | 202555569 U | 11/2012 |

(Continued)

OTHER PUBLICATIONS

Machine translation of JP2000012886A (Year: 2000).*

(Continued)

*Primary Examiner* — Ryan S Cannon
(74) *Attorney, Agent, or Firm* — Banner & Witcoff, Ltd.

(57) ABSTRACT

Systems, apparatuses, and methods are described for melting snow from a surface of a power source. The power source may be a photovoltaic (PV) module.

20 Claims, 28 Drawing Sheets

(56) References Cited

U.S. PATENT DOCUMENTS

| | | | |
|---|---|---|---|
| 2012/0290145 | A1 | 11/2012 | Joshi et al. |
| 2012/0291841 | A1* | 11/2012 | Jang .................... H01L 31/042 |
| | | | 136/244 |
| 2013/0105456 | A1 | 5/2013 | Fratti et al. |
| 2013/0220393 | A1 | 8/2013 | Reedy et al. |
| 2014/0041713 | A1 | 2/2014 | Adler et al. |
| 2015/0001201 | A1 | 1/2015 | Adler et al. |
| 2016/0105145 | A1 | 4/2016 | Drake |
| 2016/0190371 | A1 | 6/2016 | Sorloaica-Hickman et al. |
| 2016/0254780 | A1 | 9/2016 | Ito et al. |
| 2020/0395891 | A1 | 12/2020 | Mil'shtein et al. |

FOREIGN PATENT DOCUMENTS

| | | | | |
|---|---|---|---|---|
| CN | 102055368 | B | 3/2013 | |
| CN | 102215012 | B | 5/2014 | |
| CN | 103825544 | A | 5/2014 | |
| CN | 204013376 | U | 12/2014 | |
| CN | 204156540 | U | 2/2015 | |
| CN | 105871323 | A | 8/2016 | |
| CN | 206640552 | U | 11/2017 | |
| CN | 207819841 | U | 9/2018 | |
| DE | 2936764 | A1 | 3/1981 | |
| DE | 3617439 | C2 | 7/1989 | |
| EP | 0940858 | A2 | 9/1999 | |
| EP | 2769455 | B1 | 9/2018 | |
| JP | H08260638 | A | 10/1996 | |
| JP | H0923019 | A | 1/1997 | |
| JP | H10173215 | A | 6/1998 | |
| JP | 2000012886 | A * | 1/2000 | ............. H02S 40/12 |
| JP | 200091608 | A | 3/2000 | |
| JP | 2001223377 | A | 8/2001 | |
| JP | 2002339591 | A | 11/2002 | |
| JP | 2004039753 | A | 2/2004 | |
| JP | 3884627 | B2 | 2/2007 | |
| JP | 3985390 | B2 | 10/2007 | |
| JP | 201679805 | A | 5/2016 | |
| JP | 2021035181 | A | 3/2021 | |
| KR | 101820763 | B1 | 1/2018 | |
| WO | 9500806 | A1 | 1/1995 | |
| WO | 2009139586 | A2 | 11/2009 | |

OTHER PUBLICATIONS

Feb. 17, 2021—EESR—EP 20201489.0.
"Can all inverters (DC to AC converter) convert AC to DC if used in reverse?" Quora, retrieved from https://www.quora.com/Can-all-inverters-DC-to-AC-converter-convert-AC-to-DC-if-used-in-reverse.
"Solar Defrost Sheet aka Solar Sheet 3.0," PatentAuction.com, retrieved from https://www.patentauctions.com/patent.php?nb=10267.
"Schneider—Inverters Bi Directional Inverters," Current Automation, retrieved from https://www.solar-solutions.co.za/bi-directional-inverters.
"Autonomous Winter Solar Panel," Blizzard Solar, retrieved from https://www.blizzardsolar.com/autonomous-winter-solar-panel.
Bi Directional Inverters Archives, GW Store, retrieved from https://www.gwstore.co.za/product-category/inverters-regulators-batteries/inverters/bi-directional-inverters/.
ITS Power and Infrastructure PVT. Ltd.
"Winter Solutions for Ice and Snow," Scirus Technologies Inc., retrieved from http://www.scirustechnologies.com/winter_solutions_5.html.
"What is bidirectional inverter?" Quora, retrieved from https://www.quora.com/What-is-bidirectional-inverter.
"The Hain System," Solar Panel Snow Removal, Hain System, retrieved from risesolar.ca/solar-panel-snow-removal/.
"Snow-Melt for Photovoltaic Panels," Alibaba.com, retrieved from https://www.alibaba.com/product-detail/snow-melt-for-photovoltaic-panels_106235664.html.
"HAIN Industrial Flat Roof," KEI Solar, retrieved from http://www.keisolar.com/hain-industrial-flat-roof/.
T. Deng, "Bidirectional DC-AC Solution for Solar Application System, Based on the TMS320F28035 MCU," Texas Instruments, Application Report SPRAC85, May 2017.
"Can all inverters (DC to AC converter) convert AC to DC if used in reverse?" Quora, retrieved from https://www.quora.com/Can-all-inverters-DC-to-AC-converter-convert-AC-to-DC-if-used-in-reverse, Year: 2019.
"Solar Defrost Sheet aka Solar Sheet 3.0," PatentAuction.com, retrieved from https://www.patentauctions.com/patent.php?nb=10267, Year: 2019.
"Schneider—Inverters Bi Directional Inverters," Current Automation, retrieved from https://www.solar-solutions.co.za/bi-directional-inverters, Year: 2019.
"Autonomous Winter Solar Panel," Blizzard Solar, retrieved from https://www.blizzardsolar.com/autonomous-winter-solar-panel, Year: 2019.
S. Bushong, "Snow No More: Technology Keeps Solar Panels Clean," Solar Power World, Feb. 13, 2014.
Bi Directional Inverters Archives, GW Store, retrieved from https://www.gwstore.co.za/product-category/inverters-regulators-batteries/inverters/bi-directional-inverters/, Year: 2019.
"Winter Solutions for Ice and Snow," Scirus Technologies Inc., retrieved from http://www.scirustechnologies.com/winter_solutions_5.html, Year: 2019.
"What is bidirectional inverter?" Quora, retrieved from https://www.quora.com/What-is-bidirectional-inverter, year: 2019.
"The Hain System," Solar Panel Snow Removal, Hain System, retrieved from risesolar.ca/solar-panel-snow-removal/, Year: 2019.
"Snow-Melt for Photovoltaic Panels," Alibaba. com, retrieved from https://www.alibaba.com/product-detail/snow-melt-for-photovoltaic-panels_106235664.html, Year: 2019.
"How Solar Power Works in Canada," Energy Hub, Complete Guide 2018, retrieved from https://energyhub.org/how-solar-power-works-canada/.
S. Kudou, "PV System Comes With Snow-melting Function," Solar Power Plant Business, Mar. 16, 2018.
"How to Get Ready for the Future," Solaredge, Jun. 9, 2016, retrieved from https://www.solaredge.com/us/how_to_get_ready_for_the_future.
K. Zipp, "How are hybrid inverters used in solar projects?" Solar Power World, Jan. 14, 2015, retrieved from https://www.solarpowerworldonline.com/2015/01/hybrid-inverters-used-solar-projects/.
"HAIN Industrial Flat Roof," KEI Solar, retrieved from http://www.keisolar.com/hain-industrial-flat-roof/, Year: 2019.

* cited by examiner

METHOD AND APPARATUS FOR MELTING SNOW

CROSS-REFERENCE TO RELATED APPLICATIONS

This application is a continuation of U.S. application Ser. No. 17/069,988, filed Oct. 14, 2020 which claims priority to U.S. Provisional Patent Application No. 62/915,161, filed Oct. 15, 2019. The entire disclosures of the foregoing applications are incorporated by reference in their entireties.

BACKGROUND

A photovoltaic (PV) system is a power system designed to supply solar power by converting sunlight into electricity. PV systems generally include solar panels or "PV modules" (e.g. solar panels or solar shingles). PV modules include a number of solar cells. PV systems are used in commercial and residential applications. One challenge posed by PV systems is that if a PV module is partially or completely blocked from receiving sunlight, then the PV module may operate less effectively or not at all.

SUMMARY

The following summary presents a simplified summary of certain features. The summary is not an extensive overview and is not intended to identify key or critical elements.

Systems, apparatuses, and methods are described for melting snow disposed on elements of PV systems.

In some examples, a heating element included in a power device may be used to melt snow on a surface of a power source, e.g., a PV module. The heating element may be thermally coupled to the surface of the PV module and may be configured to operate in a snow melting mode of operation. The heating element may be electrically connected to another external power source. In some examples, a bidirectional inverter may be used as a system power device, and may be configured to create a reverse voltage across a string of PV modules having bypass devices or coupled to power converters having bypass devices, causing electrical current to flow through one or more bypasses devices. The bypass devices may be thermally coupled to PV modules, and may generate heat when conducting current, thereby melting the snow.

In some examples, a reverse current may be induced through the PV module, and may be used to melt snow on the surface of the PV module. The reverse current may be induced by a bidirectional power converter (e.g., a DC/AC or DC/DC converter) connected across terminals of one or more PV modules or across terminals of a string of PV modules.

In some examples, one or more cleared PV modules may be used to help clear one or more other partially or fully covered or blocked PV modules.

These and other features and advantages are described in greater detail below.

BRIEF DESCRIPTION OF THE DRAWINGS

Some features are shown by way of example, and not by limitation, in the accompanying drawings. In the drawings, like numerals reference similar elements.

DETAILED DESCRIPTION

Figure 1:
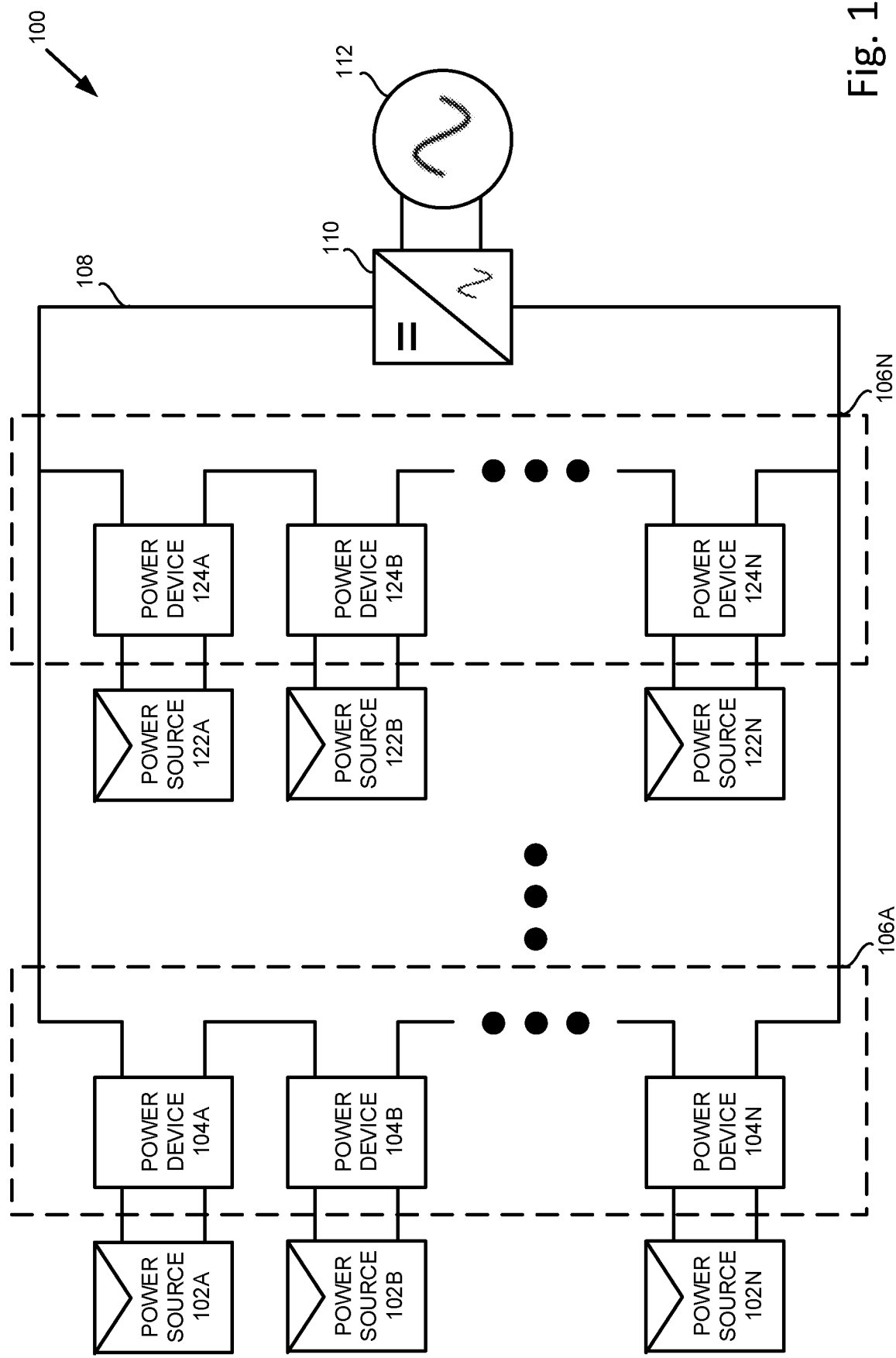
FIG. 1 illustrates a power system, in accordance with certain examples of the presently disclosed subject matter.

The accompanying drawings, which form a part hereof, show examples of the disclosure. It is to be understood that the examples shown in the drawings and/or discussed herein are non-exclusive and that there are other examples of how the disclosure may be practiced.

It is noted that the teachings of the presently disclosed subject matter are not bound by the power systems described with reference to the figures. Equivalent and/or modified functionality may be consolidated or divided in another manner and may be implemented in any appropriate combination. For example, power source 102A and power device 104A, which are shown as separate units of power system 100 in some figures, may have their functionalities and/or components combined into a single unit, e.g., by integrating power device 104A into power source 102A (for example, where power source 102A is a solar panel having a junction box, power device 104A may be integrated into the junction box).

It is also noted that the teachings of the presently disclosed subject matter are not bound by the flow charts illustrated in the figures, and the illustrated operations may occur out of the illustrated order. For example, steps 906 and 908 shown in succession in method 900 of FIG. 9 may be executed substantially concurrently or in the reverse order. It is also noted that whilst the flow charts are described with reference to elements of power systems illustrated herein, this is by no means binding, and the operations may be performed by elements other than those described herein.

It is also noted that like references in the various figures refer to like elements throughout the application.

It is also noted that the letter "N" used with reference to elements throughout the application denotes any appropriate number of elements, and is not limited by the number of the corresponding elements depicted in the figures.

It is also noted that all numerical values given in the examples of the description are provided for illustrative purposes only and are by no means binding.

The terms, "substantially", "about", "sufficient", "efficiently", and, "threshold", used herein include variations that are equivalent for an intended purpose or function (e.g., within a permissible variation range). Certain ranges are presented herein with numerical values being preceded by the terms "substantially", "about", "sufficient", and, "threshold". The terms "substantially", "about", "sufficient", and "threshold", are used herein to provide literal support for the exact number that it precedes, as well as a number that is near to or approximately the number that the term precedes. In determining whether a number is near to or approximately a specifically recited number, the near or approximating unrequited number may be a number, which, in the context in which it is presented, provides the substantial equivalent of the specifically recited number.

The term, "controller", used herein may include a computer and/or other appropriate processor/processing circuitry and memory. The terms "computer" or "processor" or variations thereof should be expansively construed to cover any kind of hardware-based electronic device with data processing capabilities including, by way of non-limiting example a digital processing device (e.g. digital signal processor (DSP), microcontroller, field programmable circuit, application-specific integrated circuit (ASIC), etc.) or a device which comprises or is operatively connected to one or more processing devices, or an analog circuit implementing control logic. The term, "memory", used herein should be expansively construed to cover any volatile or non-volatile computer memory suitable to the presently disclosed subject matter. The above may include, by way of non-limiting example, controller 1506 disclosed in the present application.

In this regard, operations in accordance with the teachings herein may be performed by a computer specially constructed for the desired purposes or by a general-purpose computer specially configured for the desired purpose by a computer program stored in a non-transitory computer-readable storage medium.

Reference is now made to FIG. 1, which illustrates a power system 100 according to examples of the present subject matter. Power system 100 may include a plurality of power sources 102 (e.g., 102A, 102B, . . . , 102N), 122 (e.g., 122A, 122B, . . . , 122N). As an example, power system 100 may be a photovoltaic (PV) power system; and power sources 102, 122 may be PV generators/PV modules, each comprising one or more solar cells connected in series and/or in parallel. Although power sources are described herein in the context of PV generators/PV modules, it will be appreciated that the term power source may include other types of power sources, for example: wind turbines, hydro-turbines, fuel cells, batteries, etc.

Power system 100 also includes a plurality of power devices 104 (e.g., 104A, 104B, . . . , 104N), 124 (e.g., 124A, 124B, . . . , 124N). Power devices 104, 124 may be or include, for example: direct current (DC) to DC converters (e.g., buck converters, boost converters, buck/boost converters, buck+boost converters), DC to alternating current (AC) converters, microinverters, etc. Power devices 104, 124 may be bi-directional converters which are configured to perform conversion in a first direction of electrical current flow in a first mode of operation, and perform conversion in a second direction of electrical current flow that is opposite to the first direction, in a second mode of operation. For example, in a first mode of operation, the converter may be configured to decrease a first greater voltage to a second lesser voltage in a first direction; and in a second mode of operation, the converter may be configured to increase a first lesser voltage to a second greater voltage in a second direction that is opposite to the first direction. As an example, the converter may be configured to either receive current from or provide current to the at least one power source.

In cases where the power device/converter provides current to the at least one power source, this current may be referred to as an "input current" to the at least one power source.

In some examples power device 104, 124 may include one or more bypass connection. The bypass connection may be one or more bypass diodes, bypass switches, bypass transistors, etc. For example, if power device 104, 124 is a DC to AC converter then power device 104, 124 may have a bypass connection that includes back-to-back MOSFET switches.

In some examples, power device 104, 124 may be a junction box without a converter attached. For example, the junction box may include a bypass connection having one or more bypass diodes without any conversion circuitry. The junction box may include monitoring and/or communication devices, safety devices (e.g., disconnect switches and/or short-circuit switches), fuses, etc.

As mentioned above, in some examples, power device 104, 124 may have multiple modes of operation.

For example, power device 104, 124 may have a mode of operation where power device 104, 124 is configured to convert power provided from a power source, and provide the converted power to a load, storage device, or the electrical grid/utility grid.

As an example of a different one of the multiple modes of operation, power device 104, 124 may also have a mode of operation where power device 104, 124 is configured to bypass a power source, e.g., when the power source is not producing a certain amount of power, so that the under-producing power source does not adversely affect the overall power production of the power system and/or cause damage to one or more solar cells.

For example, where a power source is malfunctioned, causing a potentially unsafe condition (e.g. arcing) or under-performing in a way that may affect the overall power production of the power system, power device 104, 124 may be operated to bypass the power source.

As another example of a different one of the multiple modes of operation, power device 104, 124 may also have a mode of operation where power device 104, 124 is configured to melt snow on a surface of a power source (e.g., power source 102, 122).

Also as an example of a different one of the multiple modes of operation, power device 104, 124 may have a standby mode of operation where power device 104, 124 is not turned off, but is in a mode, between other different modes of operation. For example, in a standby mode of operation, power device 104, 124 may be configured to await instruction, or determine an action to be performed, regarding a subsequent mode of operation.

Each power source 102, 122 is electrically connected to at least one respective power device 104, 124 from among the plurality of power devices 104, 124.

A plurality of power devices 104, 124 from among the total plurality of power devices 104, 124 may be electrically connected to each other. The connection between this plurality of power devices 104, 124 may be a series connection, a parallel connection, or a combination of parallel and series connection. As an example, some of the power devices 104, 124 may be connected to each other in a series connection, while other power devices 104, 124 may be connected to each other in a parallel connection. The power devices 104, 124 are connected to a bus 108. Bus 108 may be, for example, a DC bus, an AC bus, etc.

FIG. 1 illustrates a first plurality of power devices 104A-104N connected in a series connection to form a first series string 106A of power devices 104. In series string 106A, each power device 104 has at least one terminal that is connected to a terminal of another power device 104. Power devices 104 that are at an extremity of series string 106A have a terminal that is connected to bus 108. For example, power device 104A, at one extremity of series string 106A, has a first terminal that is connected to bus 108 and a second terminal that is connected to power device 104B. Power device 104B, at another extremity of series string 106A, has a first terminal that is connected to power device 104A and a second terminal that is connected to another power device (not shown). Power devices 104 that are not on one of the extremities of series string 106A also have another terminal that is connected to a terminal of another different power device 104.

Power system 100 may have a plurality of series strings 106 (e.g., 106A, 106B (not shown), . . . , 106N) of power devices 104, 124. For example, a second plurality of power devices 124A-124N are connected in series to form another series string 106N of power devices 124.

Power system 100 also includes a system power device 110. System power device 110 may be a bi-directional DC to AC converter (sometimes referred to as an inverter) configured to convert DC to AC in a first direction, and to convert AC to DC in a second direction that is opposite to the first direction. System power device 110 is connected to bus 108 and electrical grid 112. In some systems, system power device 110 may be a DC/DC converter configured to: in a first mode of operation, convert a first DC voltage from the PV modules to a second voltage at an output of the DC/DC converter (which may, e.g., be connected to an input of a DC/AC inverter); and in a second mode of operation, convert a first voltage from the output of the DC/DC converter to a second voltage across the PV modules.

Figure 15:
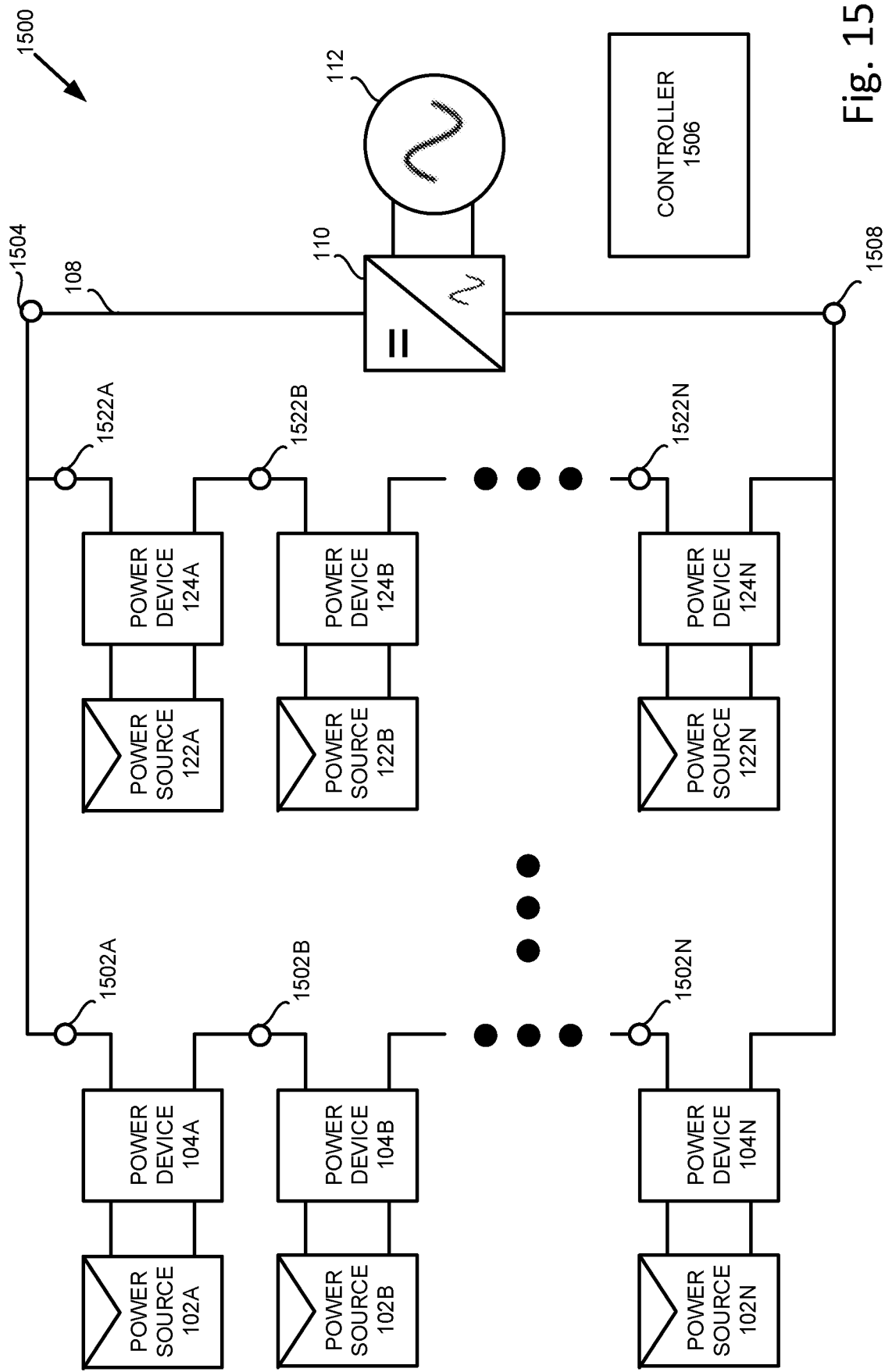
FIG. 15 illustrates a power system, in accordance with certain examples of the presently disclosed subject matter.

Power system 100 may also include one or more sensors (not depicted in FIG. 1) and one or more controllers (not depicted in FIG. 1), as illustrated in FIG. 15, described in greater detail below.

In some examples, snow is melted from the surface of the power source using a power device that includes a heating element thermally coupled to/in heating proximity to the surface of the power source. The heating element may be any appropriate electrical element capable of generating heat (e.g. a diode, resistor, etc.). It will be appreciated that in some cases the heating element of the present subject matter may have additional functions aside from producing heat. The heating element may be an electrical element that has additional function(s) (e.g. acting as a gateway, bypass, and/or provide electrical resistance) in one or more of the other, non-snow melting modes of operation. In addition, the heating element may be configured to produce heat and/or provide an electrical function when operating in a snow melting mode of operation.

The terms "thermally coupled" and "heating proximity" used herein include variations that are equivalent for an intended purpose or function (e.g., within a permissible variation range). The terms "thermally coupled" and "heating proximity" should be expansively construed to mean that the heating element is arranged in a way so that heat radiated from the heating element may provide heat near the surface of the power source, such that snow that is present on the surface will melt from the heat of the heating element.

As an example, the heating element may be one or more: DirectFET™ diodes, Schottkey diodes, resistors, semiconductor material that releases heat when there is a current flowing through it, one or more power sources itself (e.g. one or more PV modules), etc. In some examples, the heating element may include a storage device thermally coupled to a surface of the power source, where the storage device is configured to produce power for generating sufficient heat during operation in order to melt snow. For example, the storage device may be: one or more batteries, storage capacitors, flywheels, etc.

As an example, the term "sufficient heat" may refer to an amount of heat that is able to cause the surface of the power source and/or the ambient temperature of the air around/near the surface of the panel to be at a temperature that is able to melt snow on the surface. For example, sufficient heat may be a temperature that causes the surface of the power source and/or the ambient temperature of the air around/near the surface of the panel to be at a heat greater than about 32 degrees Fahrenheit/0 degrees Celsius.

In some examples, the heating element may be a controllable heating element, configured to controllably provide about a certain temperature and/or an approximate temperature in a range of temperatures.

Figure 2:
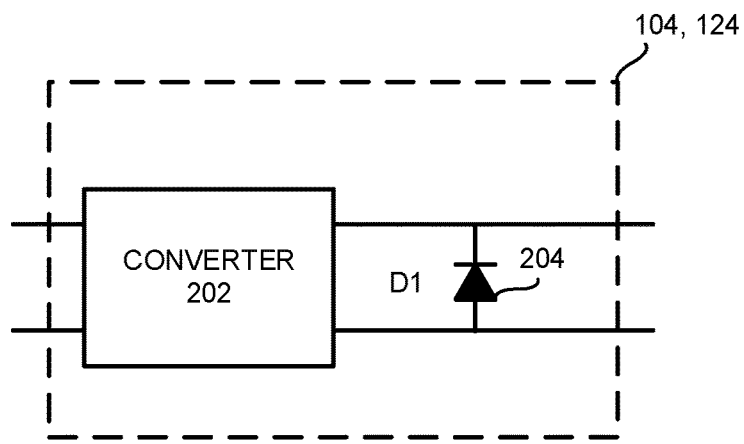
FIG. 2 illustrates a power device, in accordance with certain examples of the presently disclosed subject matter.

With reference to FIG. 2, in some examples, power device 104, 124 includes a converter 202 and a separate heating element 204. In other examples, heating element 204 may be part of converter 202. As mentioned above, in some examples power device 104, 124 does not include a converter, but does include a heating element 204 (e.g., if power device is a junction box without a converter attached, but with one or more bypass diodes).

Converter 202 may be similar to or the same as converters described as possibly being part of power device 104, 124 of FIG. 1, for example: a DC-DC converter, buck converter, buck+boost converter, DC to AC converter, etc. Converter 202 may be a bi-directional converter, i.e., a converter having a first mode of operation in which power is converted from a first set of terminals to a second set of terminals, and a second mode of operation in which power is converted from the second set of terminals to the first set of terminals.

Heating element 204 may be, for example, one or more diodes D1, such as, a bypass diode. The bypass diode may be configured to bypass the power source and/or the power converter. For example, in a series string connection of power devices, if the power source is not producing a certain amount of power, then the bypass diode may be used to bypass the power source/converter so that the under-producing power source does not adversely affect the power produced by the other power sources. For example, the bypassing of a power source may be performed using a module configured to track and assess the power production of one or more power sources, e.g. a maximum power point tracking (MPPT) module. The decision and control of the bypassing may be done, for example, using one or more controllers (e.g., a central controller and/or a local controller for the power source and/or the power module). In some cases, the bypass may be passively activated (e.g., a diode may conduct as a result of forward voltage applied to the diode due to external factors such as being connected to a string of power devices carrying current).

In some examples, the diode may be configured to be a diode that emits a relatively large amount of heat. For example, the diode may be a parasitic diode (e.g., a body diode) of a MOSFET, having poor conduction characteristics (e.g., large conduction resistance and/or forward voltage) and therefore configured to produce a relatively large amount of heat when current flows through the diode.

Figure 3A:
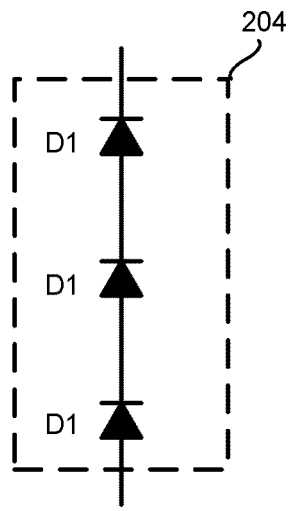
FIG. 3A illustrates a heating element, in accordance with certain examples of the presently disclosed subject matter.

FIG. 3A illustrates a heating element 204 including a plurality of diodes D1 (e.g., bypass diodes). It will be appreciated that as current flows through the plurality of diodes D1, heat may be dissipated by each of those elements. The plurality of diodes D1 may be disposed, e.g., in a junction box of a solar panel, such that when current flows through the plurality of diodes D1, heat is generated and transferred towards the surface of the solar panel.

Heating element 204 may be an active or passive heating element with one or more heat dissipating component(s)/circuit(s). Meaning, heating element 204 may be actively controlled to increase, maintain, or decrease the heat that it produces, e.g. using a controller and/or variable resistors. Alternatively, in some examples, heating element may passively produce heat without direct control of the amount of heat produced.

For example, heating element 204 may be or include a negative temperature coefficient (NTC) thermistor. NTC thermistors are a type of resistor having resistance that is dependent on temperature, more so than in general resistors. NTC thermistors may include negative temperature feedback. For example, NTC thermistors may have greater losses, and more heat radiated, at lesser temperatures (e.g., temperatures at which snow is formed). Accordingly, in some cases when the temperature is less than a particular threshold then the NTC thermistor may produce a greater amount of heat, which is used to melt snow, than when the temperature is greater than that threshold, and not as much heat is produced by the NTC thermistor.

Figure 3B:
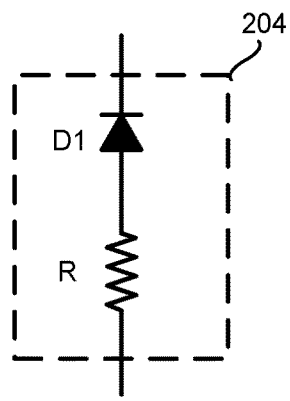
FIG. 3B illustrates a heating element, in accordance with certain examples of the presently disclosed subject matter.

FIG. 3B illustrates a heating element 204 including both a diode D1 and a resistor R (which may be an NTC thermistor, or any other appropriate resistor). It will be appreciated that as current flows through both the diode D1 and resistor R, heat may be dissipated by both of those elements.

In some examples, heating element 204 may be a bypass diode/bypass circuit that is configured so that the temperature of the heat produced by the bypass diode/bypass circuit may be controlled.

As mentioned above, in some examples, heating element 204 may be part of converter 202. Additional examples will be described below, with reference to FIG. 4A and FIG. 4B for example.

Figure 4A:
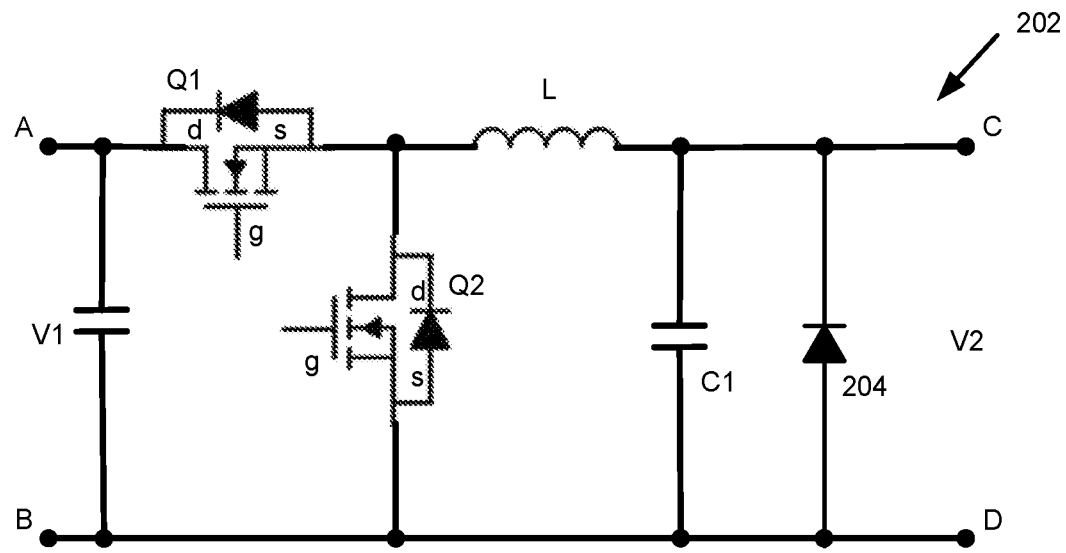
FIG. 4A illustrates a converter, in accordance with certain examples of the presently disclosed subject matter.

With reference to FIG. 4A, in some examples, converter 202 may be a buck converter. Converter 202 is shown in this particular example as a buck converter receiving power on a first plurality of terminals. The first plurality of terminals may be a pair of terminals A and B which may receive voltage V1 from a power source. The buck converter (also known as a step-down converter) is a DC to DC power converter which steps down a first voltage V1 across the first pair of terminals A and B to a reduced second voltage V2 across a second plurality of terminals. The second plurality of terminals may be a pair of terminals C and D. The buck converter converts current flowing between the first pair of terminals A and B to an increased current flowing between the second pair of terminals C and D.

Alternatively (or additionally, in case of a buck+boost converter), a boost converter (not depicted) may be used for the converter 202 (also known as a step-up converter). A boost converter is a DC to DC power converter which steps up a first voltage V1 at the first pair of terminals A and B to a second voltage V2 at the second pair of terminals C and D. The boost converter may accordingly convert the current flowing between the first pair of terminals A and B to a reduced current between the second pair of terminals C and D.

In a buck implementation of the converter 202, first voltage V1 may be supplied across a first plurality of terminals. The first plurality of terminals may be the pair of terminals A, B. The drain (d) of switch Q1 connects to terminal A. Terminal B connects to the source (s) of switch Q2, a first terminal of capacitor C1, to a first terminal of heating element 204, and to terminal D. Heating element 204 may be a bypass diode, and a first terminal of heating element 204 may be an anode of the bypass diode. The drain (d) of switch Q2 connects to the source (s) of switch Q1 and a first terminal of inductor L. Q1 and Q2 may be active switches (e.g., MOSFETs where switch Q2 is controlled to be ON when switch Q1 is OFF, and vice versa), relays, and/or the like. In some implementations, switch Q2 may be replaced with a diode corresponding to the parasitic diode shown as part of switch Q2. A second terminal of inductor L connects to a second terminal of capacitor C1, a second terminal of heating element 204, and terminal C. The second terminal of heating element 204 may be the cathode of the bypass diode.

In cases where the heating element 204 is a parasitic diode of a MOSFET, auxiliary power may be used to activate the switch (e.g., Q1, Q2) when a low-loss (e.g., low heat) bypass is desired, for example, in a case where the power source is underproducing/malfunctioned but not covered with snow. Alternatively, when the heating element 204 is a parasitic diode of a MOSFET, auxiliary power may be used to drive current through one or more MOSFETs to heat them up and melt the snow. Auxiliary power may be provided by voltage V1, voltage V2, and/or an external power source, external to the converter 202. For example, the external power source may be power from a utility grid, a storage device, a different power source 102, 122 (depicted in FIG. 1), etc.

For example, the external power source may be configured to provide power to maintain a power device in a standby mode of operation, and/or the external power source may also be configured to provide power to the power device/heating element during a snow melting mode of operation. For example, the external power source may be used, e.g., when the power source 102, 122 is unable to provide sufficient power because it is covered in snow, to monitor the conditions of the power source, and to "wake up" the power device/heating element to operate in the snow melting mode of operation, and provide power to the power device/heating element during the snow melting mode of operation. It will be appreciated that unlike in an operation where, "wake up", of a power device is generally only performed when the corresponding power source is able to produce sufficient power, in the present subject matter, "wake up", of a power device may be performed in order to operate the power device in a snow melting mode of operation (to melt snow off of the power supply).

For example, the external power source may be: the grid (with or without an inverter connected in between the grid and the power device), one or more other PV module(s), one or more power storage devices (e.g., one or more batteries), etc. The power device/heating element may be configured to draw power from these sources in the snow melting mode of operation, in order to produce a heat for melting snow on a surface of the power source.

As an example, the external power source may be a plurality of PV power sources, e.g. a string of PV generators which have been cleared from snow, which are configured to provide power to one or more other power devices to operate them in the snow melting mode of operation.

Figure 4B:
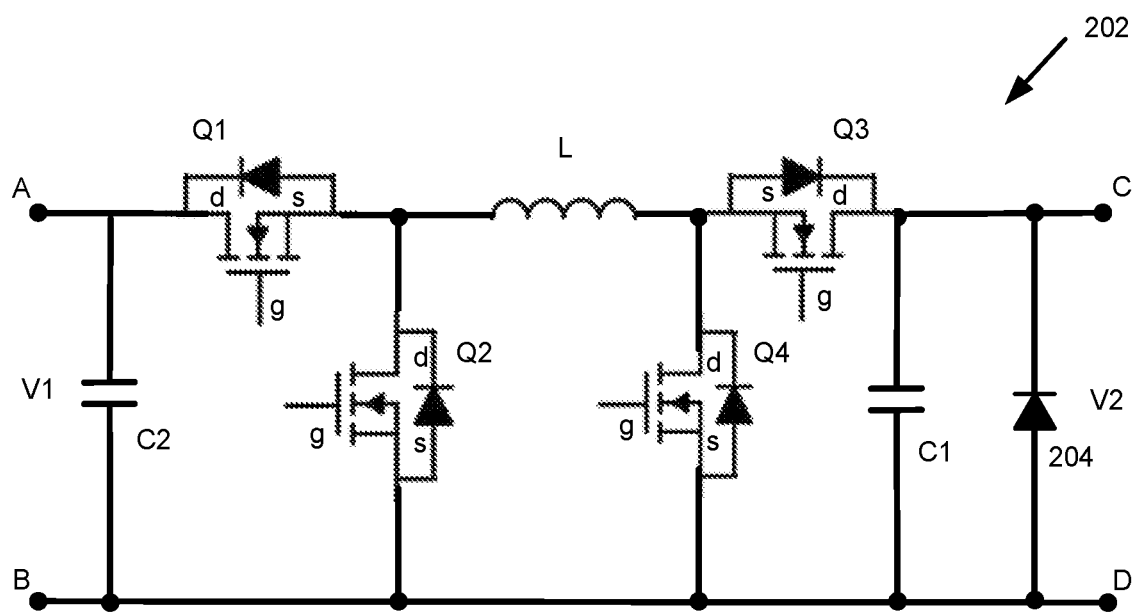
FIG. 4B illustrates a converter, in accordance with certain examples of the presently disclosed subject matter.

With reference to FIG. 4B, in some examples, converter 202 may be a buck+boost converter. Converter 202 is shown in this particular example as a buck+boost converter receiving power on a first plurality of terminals. The first plurality of terminals may be a pair of terminals A and B which may receive voltage V1 from power source 102, 122. Converter 202 converts voltage V1 to a second voltage V2 across a second plurality of terminals. The second plurality of terminals may be a pair of terminals C and D.

The buck+boost converter 202 (also known as a four-switch buck-boost converter) may be a buck (step-down) converter combined with a boost (step-up) converter. The buck+boost converter 202 may operate in a buck mode, or a boost mode, or, in some cases, in a combined buck-boost. Second voltage V2 may be of the same polarity as the first voltage V1. Second voltage V2 may have a voltage value that is either lesser or greater than the first voltage V1. The buck+boost converter 202 may use a single inductor L which is used for both the buck inductor mode and the boost inductor mode.

In a buck+boost implementation of the converter 202, first voltage V1 may be applied across the first pair of terminals A and B. The drain (d) of switch Q1 connects to terminal A and a first terminal of capacitor C2. Terminal B connects to a second terminal of capacitor C2, the source (s) of switch Q2, the source (s) of switch Q4, a first terminal of capacitor C1, a first terminal of heating element 204, and to terminal D. Heating element 204 may be a bypass diode, and the first terminal of heating element 204 may be an anode of the diode. The drain (d) of switch Q2 connects to the source (s) of switch Q1 and a first terminal of inductor L. Switches Q1-Q4 may be active switches (e.g., MOSFETs where switch Q2 is controlled to be ON when switch Q1 is OFF, and switch Q4 is controlled to be ON when switch Q3 is OFF, etc.), relays, and/or the like. A second terminal of inductor L connects to the source (s) of switch Q3 and to the drain (d) of switch Q4. The drain of switch Q3 is connected to a second terminal of capacitor C1, a second terminal of heating element 204, and terminal C. The second terminal of heating element 204 may be the cathode of the bypass diode. The heating element 204/bypass diode may be connected across terminals C and D.

As mentioned above, in some cases auxiliary power may be provided by voltage V1, voltage V2, and/or an external power source (not shown), external to the converter 202. For example, the external power source may be power from: a utility grid, a storage device, a different power source 102, 122, etc.

In addition to heating element 204 providing heat to melt snow, one or more bypass diodes of switches Q1-Q4 may be configured to be thermally coupled to a surface of the power source in order to assist in melting snow when the power device is in a snow melting mode of operation.

In some examples, the buck+boost converter 202 may include additional circuitry (not shown) in order to help change the mode of operation of the converter 202 from a standby mode to a snow melting mode. This additional circuitry may be configured to process various signals related to the mode of operation. For example, a first signal may indicate a first mode of operation of the converter 202 (e.g., standby mode), and a second signal may indicate a second mode of operation of the converter 202 (e.g., snow melting mode).

As mentioned above, in some cases, if power device 104, 124 is a DC to AC converter then power device 104, 124 may include back to back MOSFETS. In some cases, the heating element 204 may be one or more body diodes of the MOSFETS. For example, the power device may be configured so that when a first one of the MOSFETS is ON, current is driven through a body diode of the second MOSFET in order to provide heat to the surface of the power device. It will be appreciated that unlike typical arrangements, in the present subject matter the body diodes may be arranged in a manner on the power device such that they are configured to produce a heat that may heat a surface of the power device directed towards the sun, and melt snow on that surface.

Figure 5:
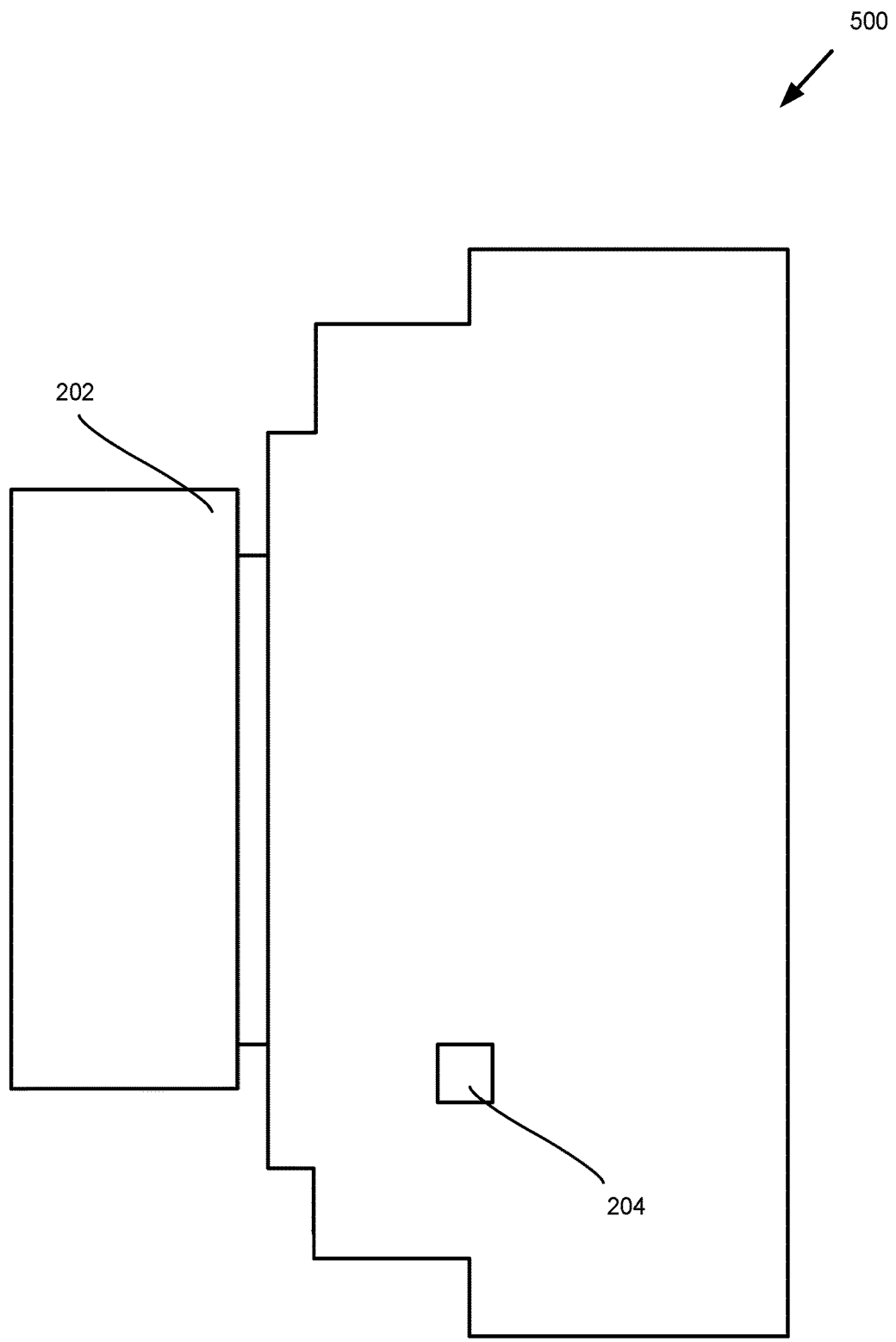
FIG. 5 illustrates a printed circuit board, in accordance with certain examples of the presently disclosed subject matter.

Reference is now made to FIG. 5, which illustrates a printed circuit board (PCB) 500, in accordance with certain examples of the presently disclosed subject matter. PCB 500 may be/be part of a power device 104, 124. PCB 500 may include a converter 202, e.g. buck, buck+boost, etc., and a heating element 204, e.g. diode, bypass diode, etc. PCB 500 may be configured to be mechanically coupled to a housing, e.g. a plastic box, for holding the power device 104, 124 and attaching the power device 104, 124 to the power source 102, 122, e.g., a PV module.

Figure 6A:
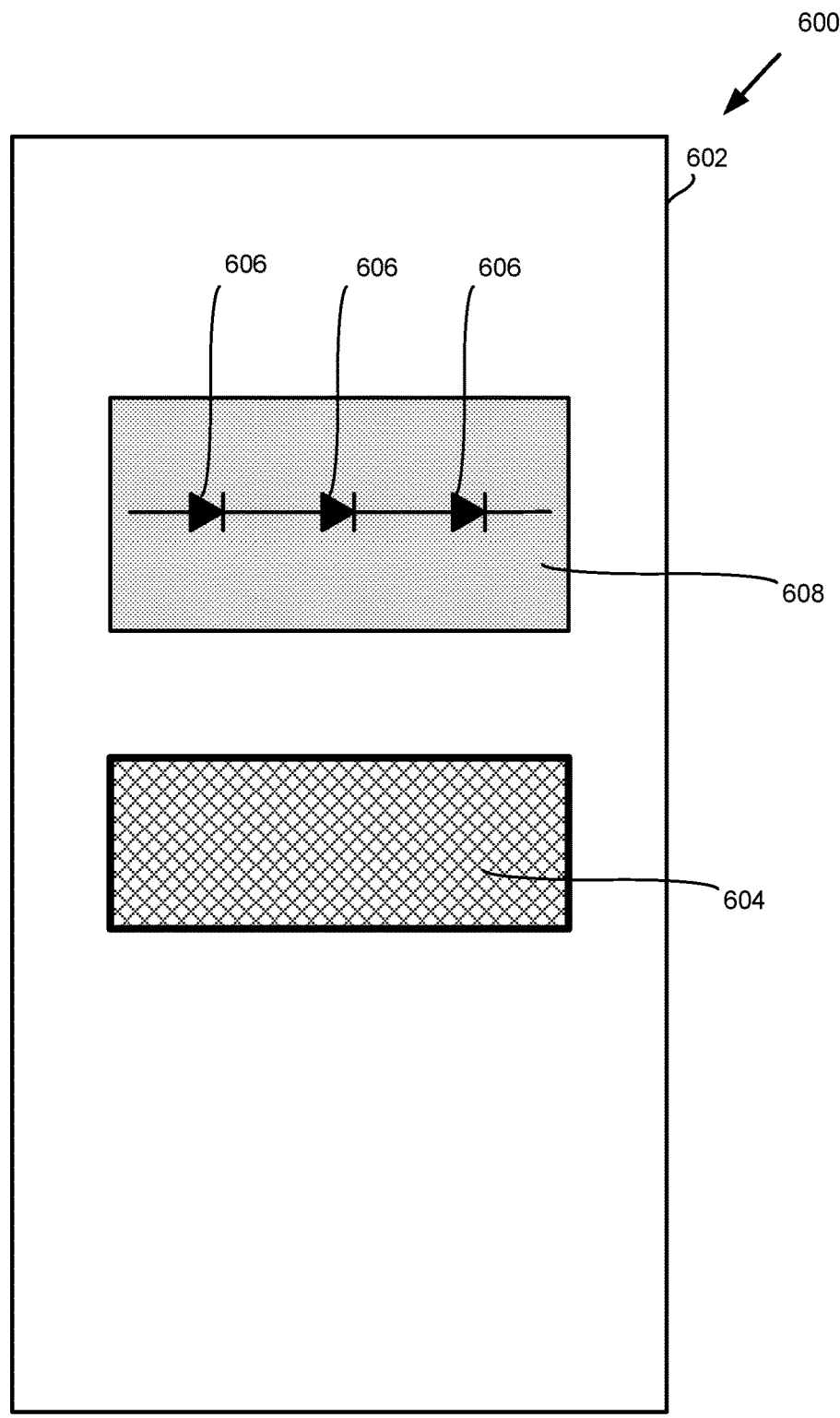
FIG. 6A illustrates a housing for a power device, in accordance with certain examples of the presently disclosed subject matter.

Reference is now made to FIG. 6A, which illustrates the inside of a housing 600 for a power device 104, 124, in accordance with certain examples of the presently disclosed subject matter. Housing 600 may include an exterior 602, which may be a hard plastic exterior, for mounting to a surface of a power source 102, 122, e.g., a PV module. Housing 600 may also include at least a portion of thermally conductive material 604. In some examples, thermally conductive material 604 may be configured as a heat spreader and/or a heat sink. Thermally conductive material may have an area that is relatively large compared to the area of heating element in order to help ensure that the heat generated by heating element is spread properly (e.g., not overly concentrated).

As an example thermally conductive material 604 may be a material that is relatively good at conducting heat. For example, thermally conductive material 604 may be: metal, thermally conductive plastic, graphite, a combination of materials, etc. As an example thermally conductive material 604 may have a value of thermal conductivity of about tens of Watts per meter per Kelvin to hundreds of Watts per meter per Kelvin. For example, thermally conductive material 604 may be a metal with a value of thermal conductivity of about 50-150 Watts per meter per Kelvin.

Housing 600 may be configured so that when a heating element 204, such as a heating element 204 included on a PCB 500, is affixed inside housing 600, the heating element 204 is located adjacent to thermally conductive material 604. Housing 600 may also be configured so that when housing 600 is mounted to a power source 102, 122, e.g. PV module, thermally conductive material 604 is located adjacent to a surface of the power source 102, 122. This arrangement may help facilitate heating element 204 to be thermally coupled/in heating proximity to a surface of the power source 102, 122.

Housing 600 may include one or more diodes 606. Diodes 606 may be connected to and/or housed in housing 600. Diodes 606 may be bypass diodes for bypassing the power source 102, 122 and/or power device 104, 124. Diodes 606 may be external to the power device 104,124, e.g. PCB 500. Diodes 606 may or may not be part of heating element 204. Diodes 606 and/or housing 600 may include one or more wires, terminals, or other connectors for connecting diodes 606 to a power source 102, 122 and/or a power device 104, 124.

A second portion of thermally conductive material (608) on the side of housing 600 arranged to be attached to the power source 102, 122 may be located between diodes 606 and the power source 102, 122. This second portion of thermally conductive material 608 associated with diodes 606 may be made of the same material as thermally conductive material 604, or a different thermally conductive material. For, example thermally conductive material 604 may be a metal, and the second portion of thermally conductive material 608 may be a thermally conductive plastic. As an example, the second portion of thermally conductive material may have a value of thermal conductivity of about tens of Watts per meter per Kelvin. For example, the second portion of thermally conductive material 608 be a polymer/plastic with a value of thermal conductivity of about 30-40 Watts per meter per Kelvin.

The remainder of housing 600 that is not made from thermally conductive material 604 or thermally conductive material 608, may have a lesser thermal conductivity than thermally conductive material 604 and/or thermally conductive material 608.

In some examples, housing 600 may include another portion of thermally conductive material 604 located on a different side of the inside and/or outside of housing 600 (not shown), e.g. a side of the housing that is opposite from/parallel to the side of housing 600 that is attached to the power source 102, 122. In these examples, the other portion of thermally conductive material 604 located on the side of housing 600 located away from the power source 102, 122 may help dissipate heat in a direction away from the surface of the power source 102, 122, for example, when the power device 104, 124 is not operating in a snow melting mode of operation, and/or to help ensure that the power device 104, 124 does not overheat. In other cases, the different side of housing 600 may be substantially perpendicular to the side of housing 600 that is attached to the power source 102, 122. In some examples, this other portion of thermally conductive material located on a different side of housing 600 may be the same thermally conductive material as the first portion of thermally conductive material 604, or a different thermally conductive material.

In some examples, an additional heating element 204, e.g. one or more diodes (not shown) aside from diodes 606 and any bypass diodes on the PCB, may also be placed in housing 600. The one or more additional diodes may be similar to diodes 606 and may operate as/in addition to heating element 204. As an example, the one or more diodes may be relatively "lossy" and configured to generate a relatively large amount of heat when power device 104, 124 is operating in a snow melting mode of operation.

Figure 6B:
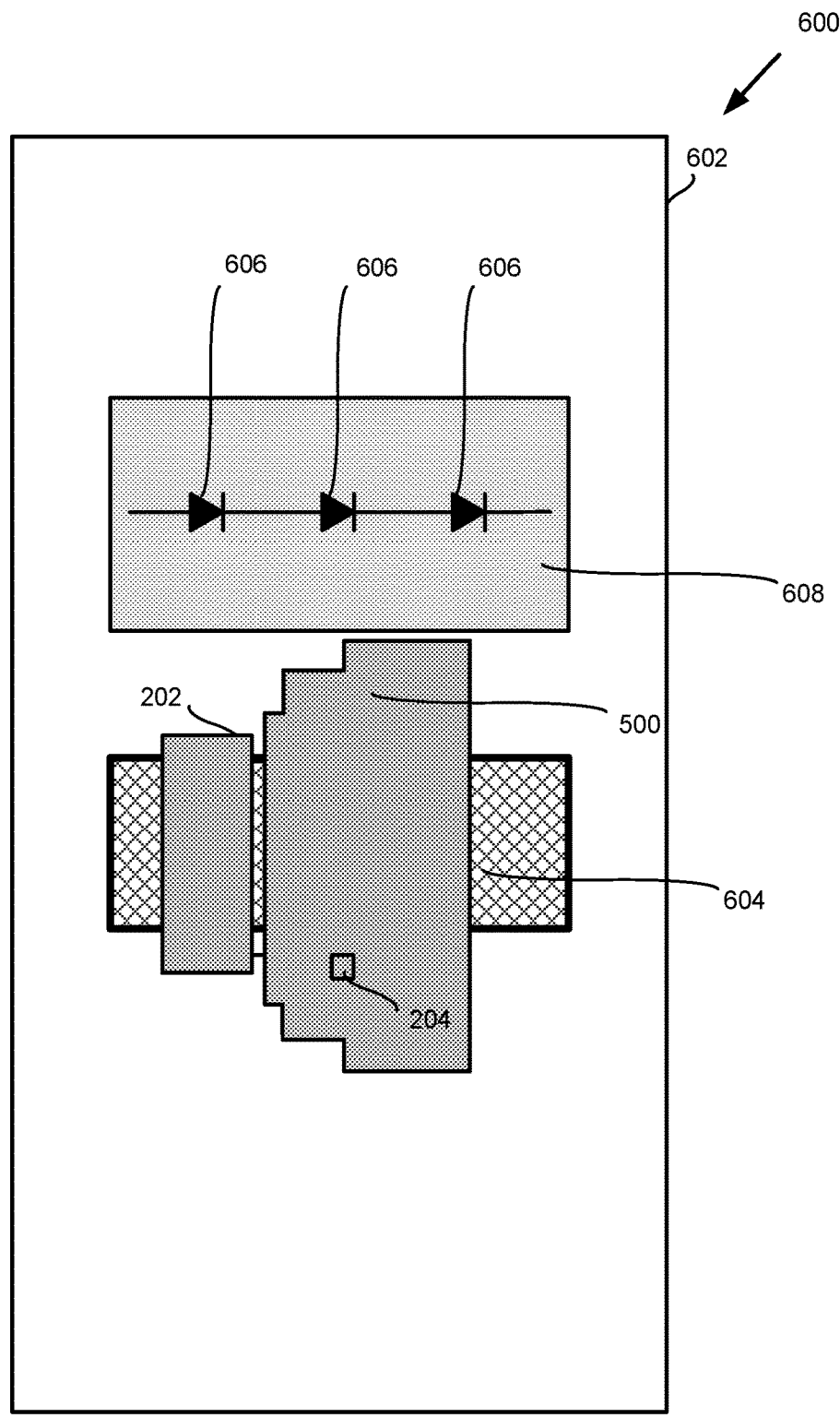
FIG. 6B illustrates a housing for a power device, in accordance with certain examples of the presently disclosed subject matter.

Reference is now made to FIG. 6B, which illustrates a power device housing 600 with a PCB 500 mounted inside, in accordance with certain examples of the presently disclosed subject matter. PCB 500 may be mounted/affixed to housing 600 using any appropriate elements/methods. For example, PCB 500 may be mounted/affixed to housing 600 using: bolts, screws, clasps, etc.

It will be appreciated that in some examples, the heating element may be an element typically arranged on a PV module in a way to avoid heating the power source, but in the presently disclosed subject matter, the location of the heating element relative to a surface of the power source is re-arranged such that the heating element is configured to heat the surface of the power source when in a snow melting mode of operation. For example, the heating element may be a resistor, diode, junction box diode, bypass diode, power device diode, etc., that generally is positioned such that the heating element forms a thermal heat dissipation path away from the surface of a PV module, but in this case the heating element is positioned such that the thermal heat dissipation path faces towards the surface of the PV module. The heating element may be arranged so that it does not damage a PCB and/or the components of the PCB of the power device.

Figure 7A:
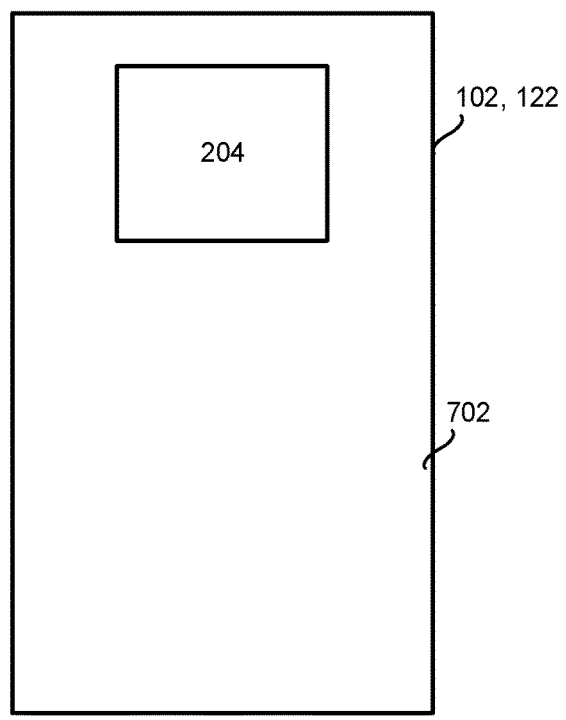
FIG. 7A illustrates a PV module with heating element, in accordance with certain examples of the presently disclosed subject matter.
Figure 7B:
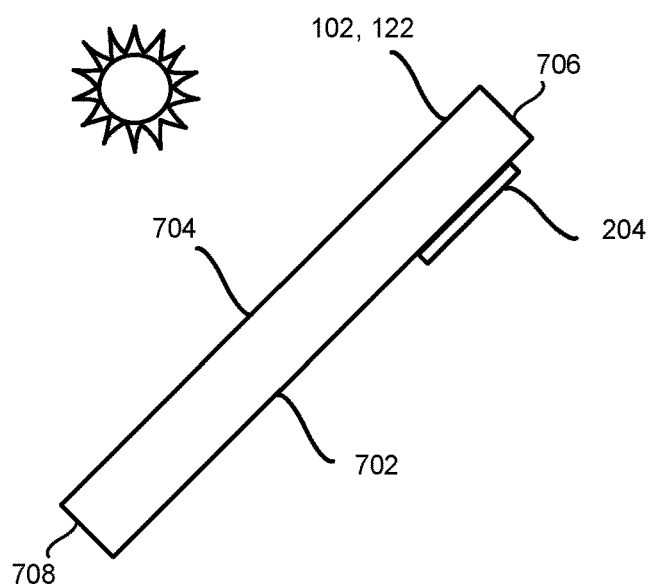
FIG. 7B illustrates a PV module with heating element, in accordance with certain examples of the presently disclosed subject matter.

Reference is now made to FIGS. 7A-7B, which illustrate a PV module 102, 122 with a heating element 204 thermally coupled in heating proximity to a surface of the PV module 102, in accordance with certain examples of the presently disclosed subject matter. FIG. 7A illustrates a top view of a bottom side of PV module 102, 122, in accordance with certain examples of the presently disclosed subject matter. FIG. 7B illustrates a side view of PV module 102, 122, in accordance with certain examples of the presently disclosed subject matter. FIG. 7B includes a depiction of the sun to indicate a side of PV module 102, 122 facing the sky, the sun is depicted for illustrative purposes only.

Heating element 204 may be attached to a first surface 702 of PV module 102, 122. First surface 702 may be a surface of PV module 102, 122 configured to be directed towards and face the ground, and not be directed towards the sun. Although positioned on a surface 702 not directed towards the sun, heating element 204 may be configured to provide heat to a second surface 704, opposite to surface 702, that is directed towards the sun, e.g., when melting of snow on the second surface 704 is desired. Placing the heating element 204 on surface 702 allows the heating element not to obscure or block any solar cells on the second surface 704 of PV module 102, 122.

Heating element 204 may be arranged on or near a side 706 of PV module 102, 122 that is configured to be more elevated than an opposite side 708 of the PV module 102, 122. The "top portion" of the PV module 102, 122 may be an upper portion of the PV module 102, 122 located on or near the elevated side 706 of the PV module 102, 122 that is arranged to be higher than the opposite lower side 708 of the PV module 102, 122. Arranging heating element 204 at or near the "top portion" of PV module 102, 122 enables snow that is melted at the elevated part of PV module 102 to, 122 assist in the removal of snow on the "bottom portion", which may be a lower portion of the PV module 102, 122 located at or near the opposite lower side 708 of the PV module 102, 122. This may allow snow to be cleared more easily from an outer surface 704 of the PV module 102, 122.

Figure 7C:
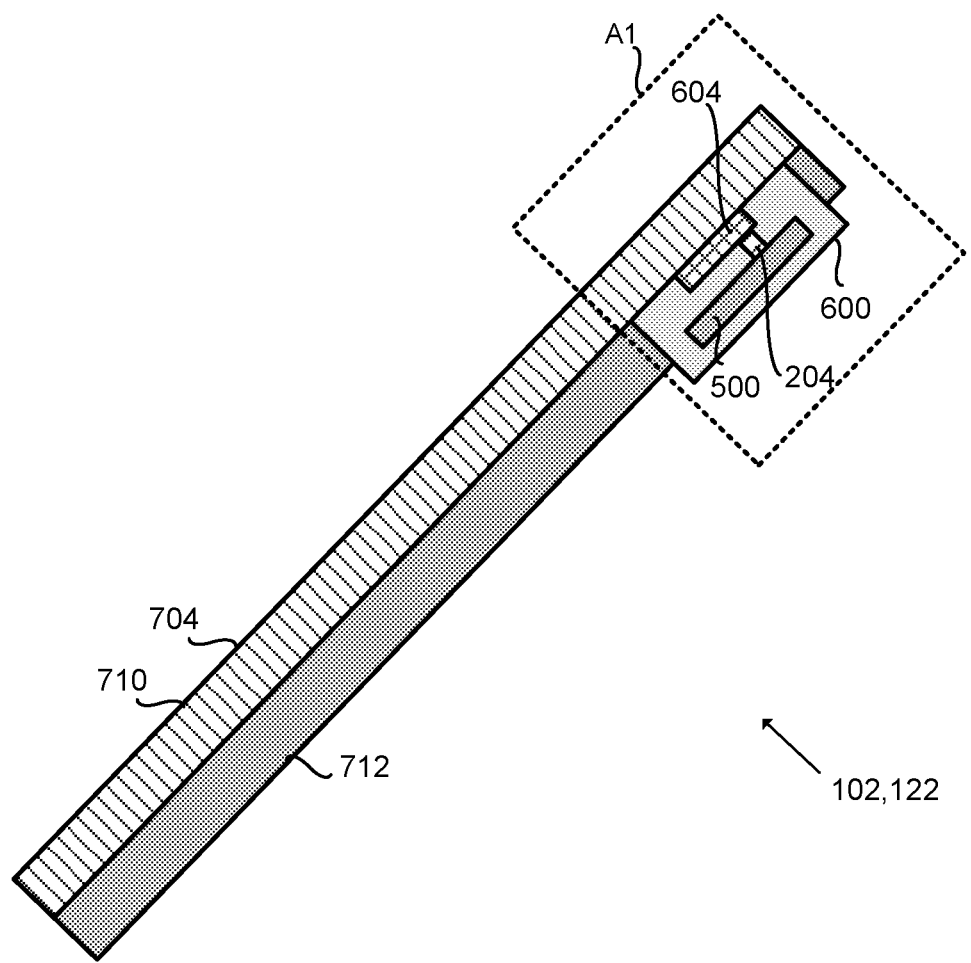
FIG. 7C illustrates a PV module with heating element, in accordance with certain examples of the presently disclosed subject matter.
Figure 7D:
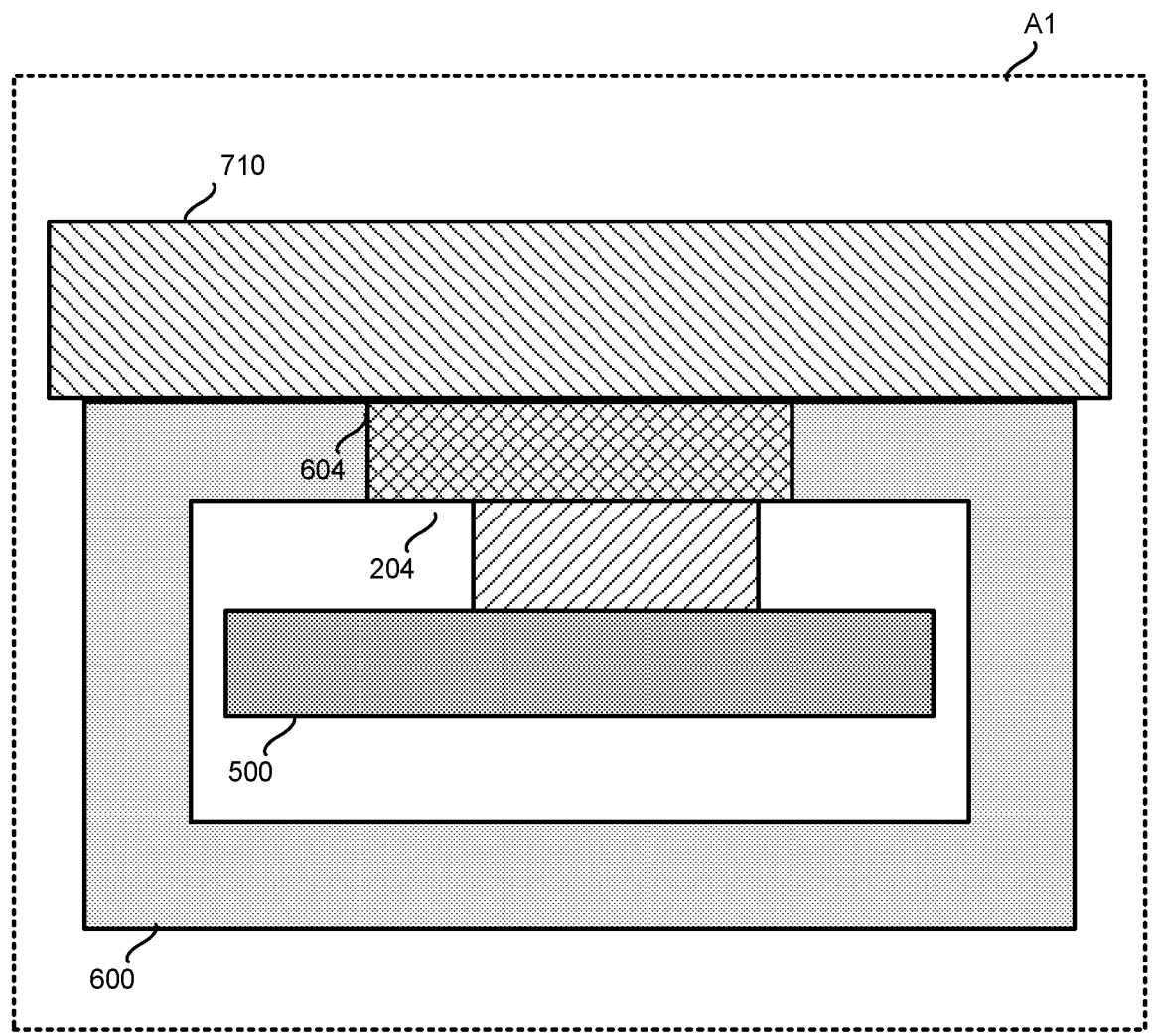
FIG. 7D illustrates a PV module with heating element, in accordance with certain examples of the presently disclosed subject matter.

Reference is now made to FIG. 7C, which illustrates a side cross-sectional view of a PV module 102, 122 with a heating element 204 thermally coupled in heating proximity to a surface of the PV module 102, 122, in accordance with certain examples of the presently disclosed subject matter. Reference is also made to FIG. 7D, which illustrates a zoomed in view of a portion A1 of the PV module 102, 122 of FIG. 7C, in accordance with certain examples of the presently disclosed subject matter. Generation surface 710 may comprise photovoltaic cells covered by a sheet of glass or a different transparent material. Generation surface 710 may be at least part of the outer surface 704 of the PV module 102, 122. Generation surface may be supported by a support surface 712. Housing 600 is coupled to generation surface 710 and houses circuitry such as PCB 500. Housing 600 may be coupled to generation surface 710 using any appropriate coupling elements (e.g., screws, clips, bolts, glue, etc.). PCB 500 includes a heating element 204, e.g., one or more diodes/transistors. Heating element 204 is thermally coupled to generation surface 710 via a thermally conductive portion of housing 600 made from thermally conductive material 604.

Figure 7E:
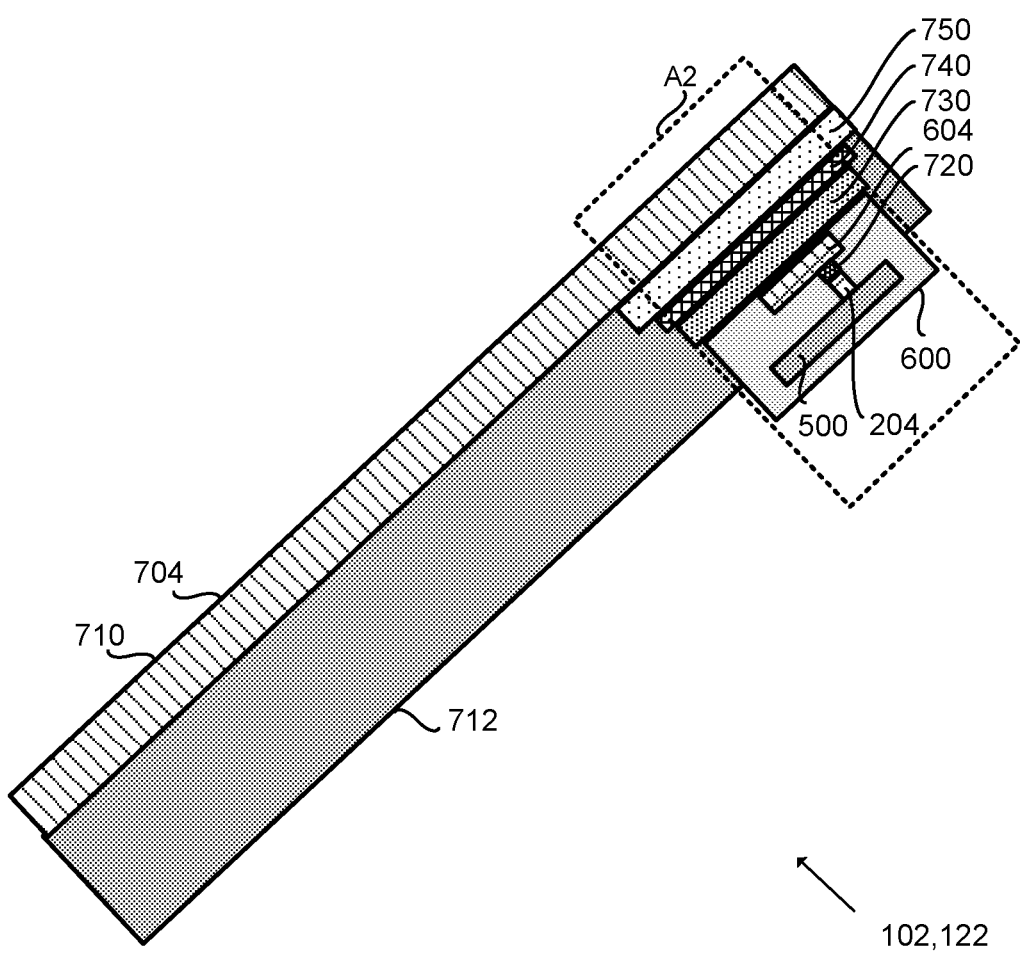
FIG. 7E illustrates a PV module with heating element, in accordance with certain examples of the presently disclosed subject matter.
Figure 7F:
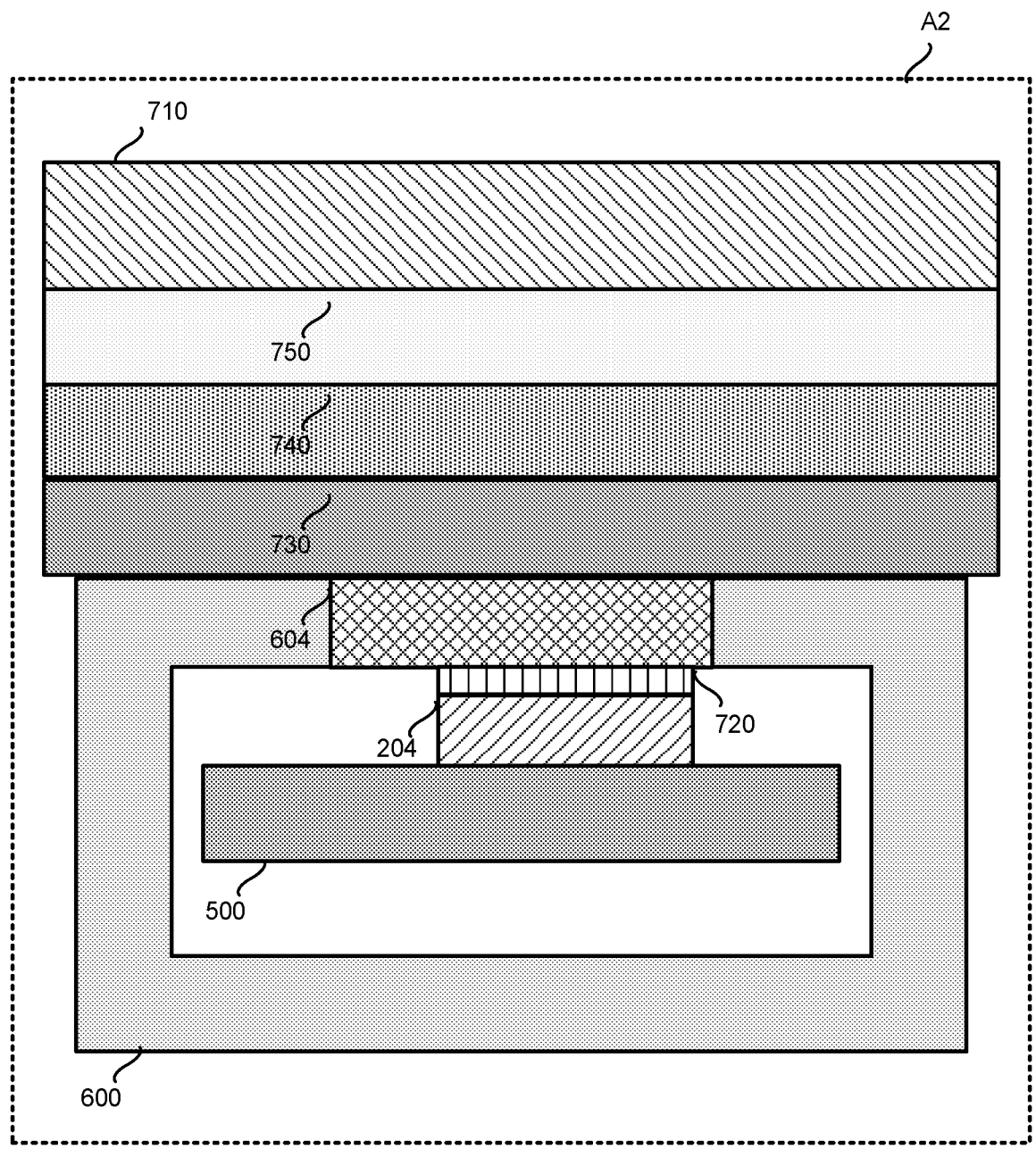
FIG. 7F illustrates a PV module with heating element, in accordance with certain examples of the presently disclosed subject matter.
Figure 7G:
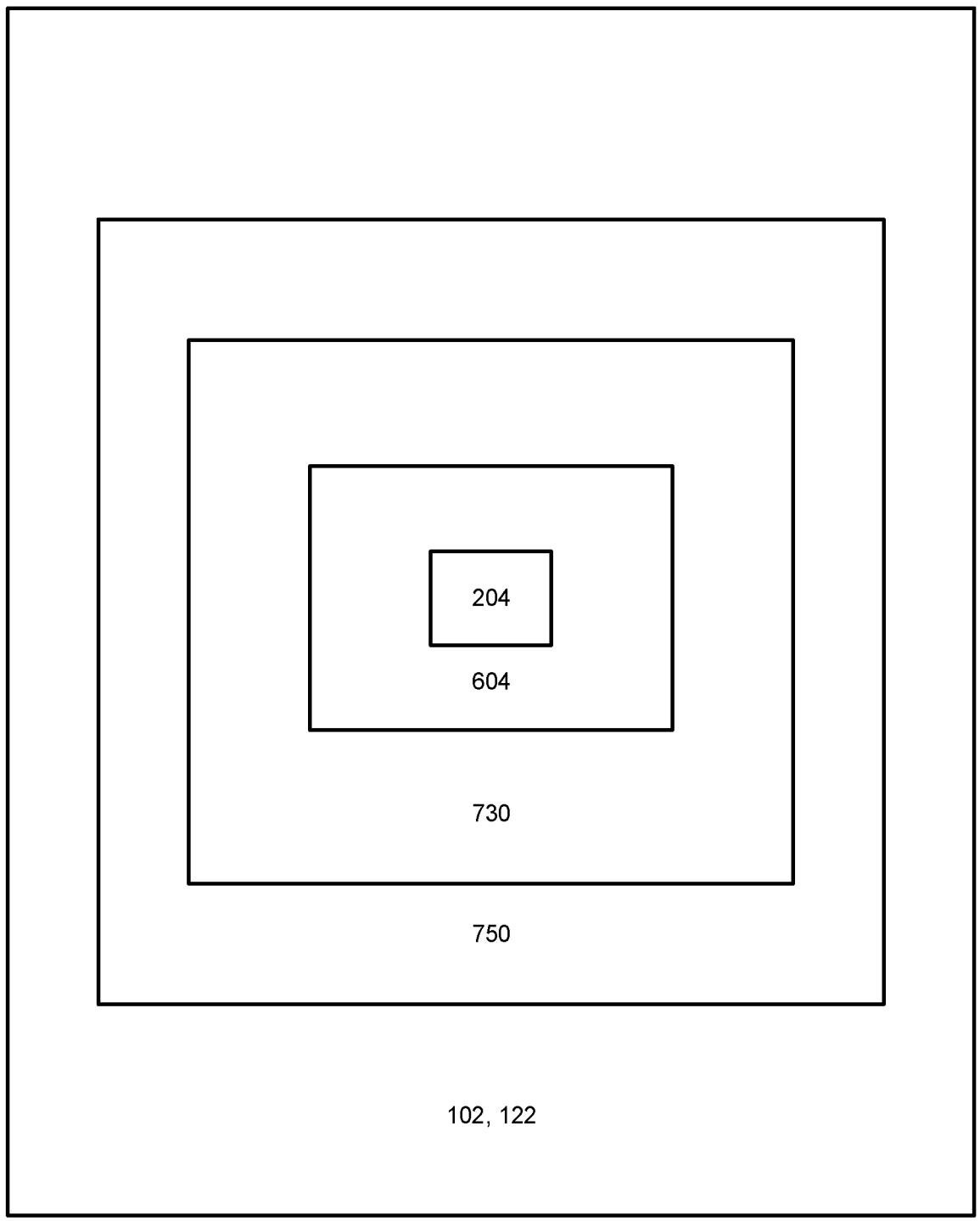
FIG. 7G illustrates a PV module with heating element, in accordance with certain examples of the presently disclosed subject matter.

Reference is now made to FIG. 7E, which illustrates a side cross-sectional view of a PV module 102, 122 with a heating element 204 thermally coupled in heating proximity to a surface of the PV module 102, 122, in accordance with certain examples of the presently disclosed subject matter. Reference is also made to FIG. 7F, which illustrates a zoomed in view of a portion A2 of the PV module 102, 122 of FIG. 7E, in accordance with certain examples of the presently disclosed subject matter. As in the examples of FIGS. 7C and 7D, generation surface 710 may comprise photovoltaic cells covered by a sheet of glass or a different transparent material. In this case, heating element 204 may be coupled to thermally conductive material 604 of housing 600 via a coupling material 720. Coupling material 720 may be thermally conductive. For example, coupling material 720 may be a thermally conductive coupling material such as: thermal putty, thermal glue, etc. As mentioned above, in some cases thermally conductive material 604 may be a heat spreader with a relatively large area compared to heating element 204. In this case, thermally conductive material 604 is coupled to PV module 102, 122 via an electrically isolating/insulating material 730, a filler 740, and a heat sink 750.

Electrically isolating/insulating material 730 may protect a person coming in contact with the apparatus from potential danger of electrical shock. Electrically isolating/insulating material 730 may be any appropriate material that does not/is poor at conducting electricity.

As an example, electrically isolating/insulating material 730 may be a laminate layer made out of a plastic material. In some cases, electrically isolating/insulating material 730 may also not/be poor at conducting heat. In such cases the heating element 204 will be configured to be thermally coupled to/in heating proximity of a surface of PV module 102, 122 despite the poor/non-thermal conductivity of electrically isolating/insulating material 730.

Filler 740 may fill gaps between the electrically isolating/insulating material 730 and the heat sink 750. Filler 740 may be any appropriate material that fills the gaps between the electrically isolating/insulating material 730 and the heat sink 750. For example, filler 740 may be: thermal grease, air, etc.

Heat sink 750 may be coupled to PV module 102, 122. Heat sink 750 may be configured to disperse heat in an efficient manner. Heat sink 750 may include one or more heat spreading elements or be made from a material that is relatively good at conducting/spreading heat. As an example, heat sink 750 may include one or more fins configured to help spread the heat generated by heating element 204 to a surface of PV module 102, 122.

The various elements described in detail above may help form a thermal heat dissipation path that goes from heating element 204 to the surface of PV module 102, 122/the ambient air around a surface of PV module 102, 122, via the various elements.

Reference is now made to FIG. 7E, which illustrates a bird's eye view of a backside of PV module 102, 122 having a heating element 204. In FIG. 7E, some elements which may be present in the apparatus are not illustrated for the sake of simplicity (e.g. housing 600, coupling material 720, filler 740, etc.). Heating element 204 is thermally coupled to/in heating proximity of a surface of PV module 102, 122 via a thermal heat dissipation path including: thermally conductive material 604, electrically isolating/insulating material 730, and heat sink 750. As mentioned above, electrically isolating/insulating material 730 may provide protection to a person who comes into contact with the apparatus.

Figure 8:
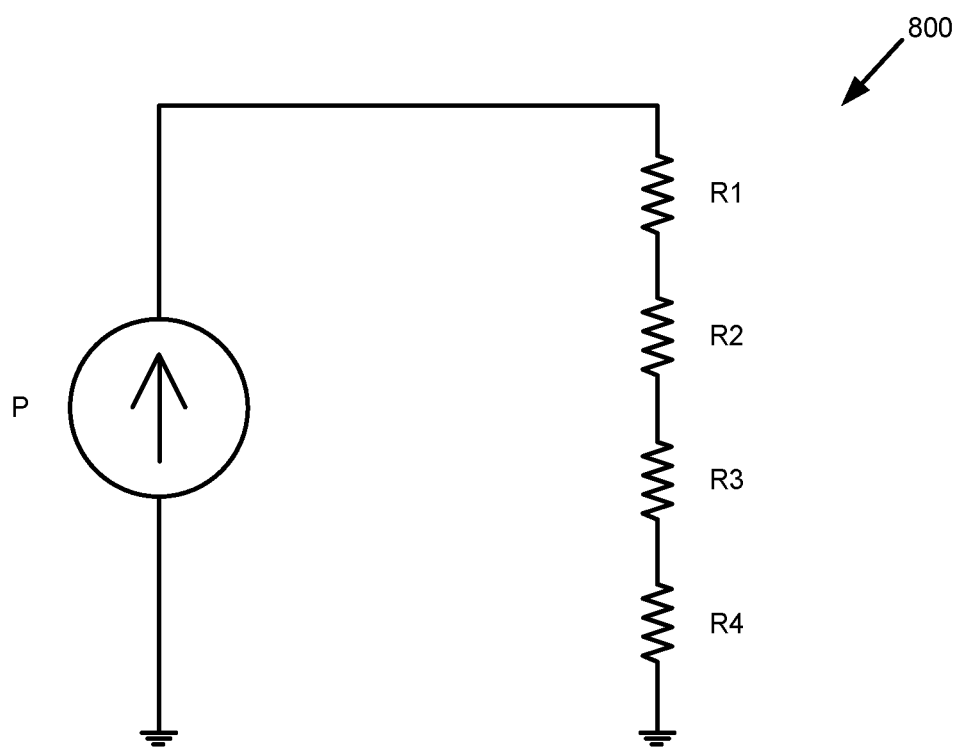
FIG. 8 illustrates a diagram representing thermal components, in accordance with certain examples of the presently disclosed subject matter.

Reference is now made to FIG. 8 which illustrates a diagram 800 representing various thermal components related to the thermal coupling of heating element 204 in a heating proximity of a surface of a power source, in accordance with certain examples of the presently disclosed subject matter.

Although FIG. 8 refers to thermal components, for the sake of clarity and simplicity FIG. 8 depicts components typically used to represent electrical components in order to represent thermal components. An analogy between a power source P with respect to thermal resistance elements R1-R4 may be akin to a relationship between a current source and electrical resistors.

Source P represents the thermal component that relates to dissipated power (losses) of heating element 204. Source P may represent the amount of heat that heating element 204 produces at a given time in a given scenario.

Resistor R1 represents a thermal component that relates to thermal resistance between an interior portion of heating element 204 to an exterior portion of heating element 204 (e.g., between the inside of a housing containing heating element 204 to the outside of the housing).

Resistor R2 represents a thermal component that relates to thermal resistance between an exterior portion of heating element 204 to a heat spreader interface. The heat spreader interface may be configured to help spread the heat dissipated by heating element 204. The heat spreader interface may include additional thermal conductive materials and/or electrical isolators/insulators to assist in the dissipation of the heat. For example, the heat spreader interface may be a portion of a housing 600 made from thermally conductive material 604.

Resistor R3 represents a thermal component that relates to thermal resistance between the heat spreader interface to the surface interface. The surface interface may be a surface of the power source to which the heating element 204 is attached. The surface interface may include additional thermal conductive materials and/or electrical isolators/insulators.

Resistor R4 represents a thermal component that relates to thermal resistance between the surface interface to an ambient interface. The ambient interface may be an area around a surface of the power source. For example, the ambient interface may be an area on a surface of the power source that is configured to be directed towards the sun, and that may be covered with snow.

When designing/choosing the heating element 204 to be operable in a snow melting mode of operation, diagram 800, or a different similar diagram, may be considered in order to help ensure that the heating element may produce sufficient heat to be thermally coupled to/in heating proximity of the surface of the power source in order to melt snow on the surface of the power source.

Figure 9:
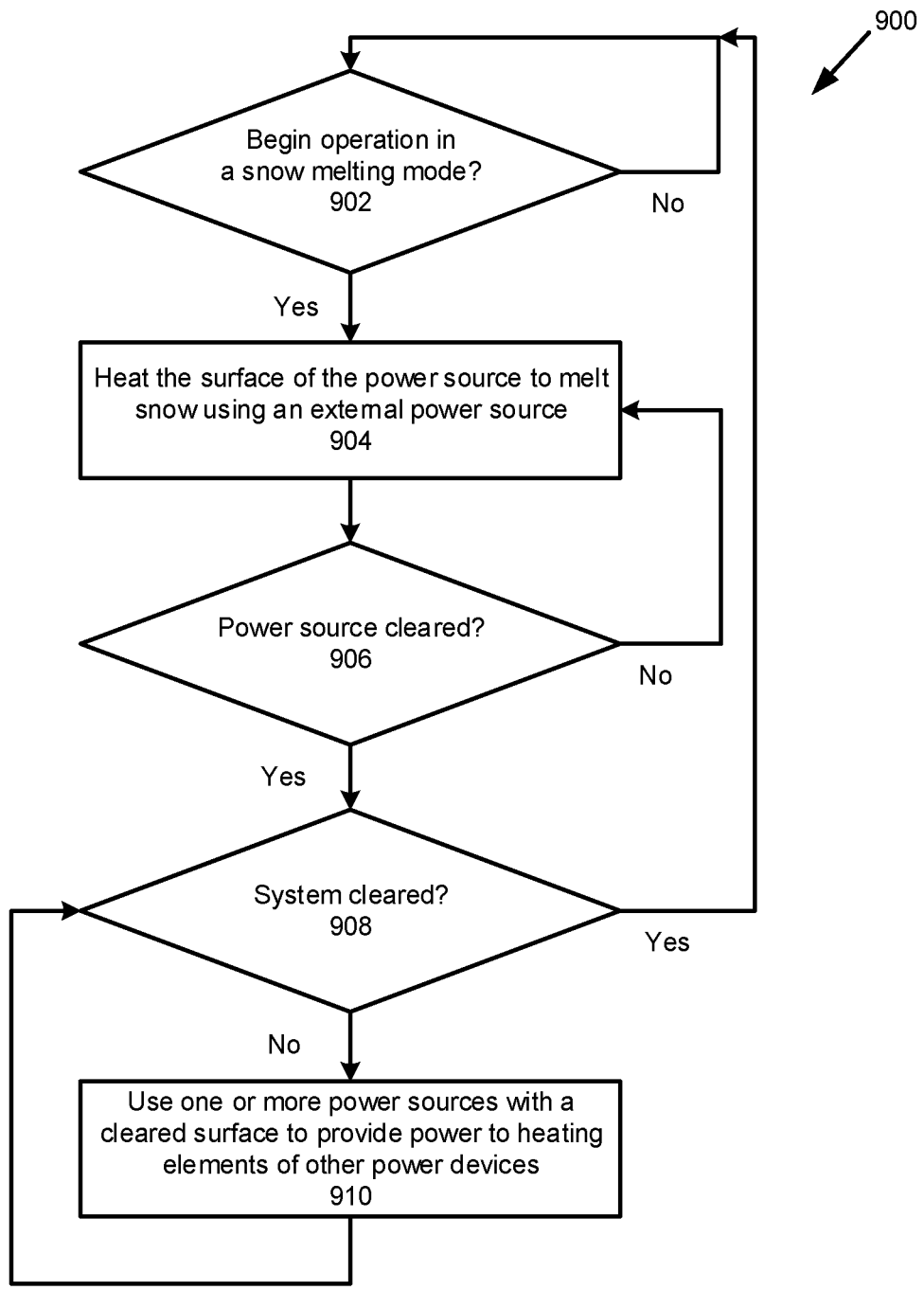
FIG. 9 illustrates a flow chart showing an example method for melting snow, in accordance with certain examples of the presently disclosed subject matter.

Reference is now made to FIG. 9, which illustrates a flow chart showing an example method 900 for melting snow, in accordance with certain examples of the presently disclosed subject matter.

At step 902, a determination is made whether a power device should begin to operate in a snow melting mode of operation. For example, a power device may have a plurality of modes of operation (e.g., standby mode, conversion in a direction from the power source to the inverter mode/PV power conversion mode, bypass mode, snow melting mode, etc.).

An example of this determination will be described in greater detail below with reference to FIG. 16. As an example, the determination may be made using one or more controllers, e.g., in the power device and/or inverter. The determination may be based on and/or in response to one or more parameters/parameter data obtained by one or more sensors.

For example, the one or more parameters/parameter data may be compared to a particular threshold in order to determine the mode of operation.

As an example, the one or more parameters/parameter data may relate to one or more elements of the power system. For example, the one or more parameters/parameter data may relate to: the power device, the converter, the heating element, the power source, the surface of the power source, an external power source, the inverter, etc.

Parameter data may refer to a particular parameter (e.g. obtained by one or more sensors/controllers) and/or data related to the particular parameter. Alternatively, parameter data may refer to data derived from a particular parameter (e.g. derived by the sensors/controllers) or data related to the derived data. For example, the parameter data may include: temperature parameter data, electrical (e.g. voltage, current, power, etc.) parameter data, time parameter data, irradiance parameter data, etc.

As an example, the temperature parameter data may relate to: a temperature of the surface of the power source, an ambient temperature of the area surrounding the surface of the power source, a temperature of the heating element, etc. The temperature parameter data may be in, for example, degrees Fahrenheit, degrees Celsius, degrees Kelvin, etc.

As an example, the electrical parameter data may relate to: current, voltage, power, etc.

As an example, the time parameter data may relate to: time of day, day of week, day of month, month of year, etc.

As an example, the irradiance parameter data may relate to: irradiance of a surface of the power source, a predicted irradiance of a surface of the power source, irradiance of a surface of another nearby power source, etc.

If the device carrying out method 900 determines that the associated power device should not begin to operate in a snow melting mode, then the step of determining may be performed again at a later time. For example, the step of determining may be performed again based on and/or in response to the passage of a certain interval of time, and/or based on and/or in response to one or more sensed conditions. As an example, the determination may be triggered based on and/or in response to certain parameter data being obtained.

If the device carrying out method 900 determines that the associated power device is to operate in a snow melting mode, then the process proceeds to step 904. For example, with reference to FIG. 10A, in a situation where surfaces of all of the power sources 102, 122 are at least partially obscured by snow in a way that the power sources 102, 122 are unable to produce power at all or efficiently (the blockage by snow being represented in the figures by the crisscross shading on the power sources 102, 122), then the power devices 104, 124 may be operated in a snow melting mode based on and/or in response to a determination to do so.

At step 904, the surface of the power source may be heated using a different and/or another external power source in order to melt snow and clear the surface of the power source.

Figure 10A:
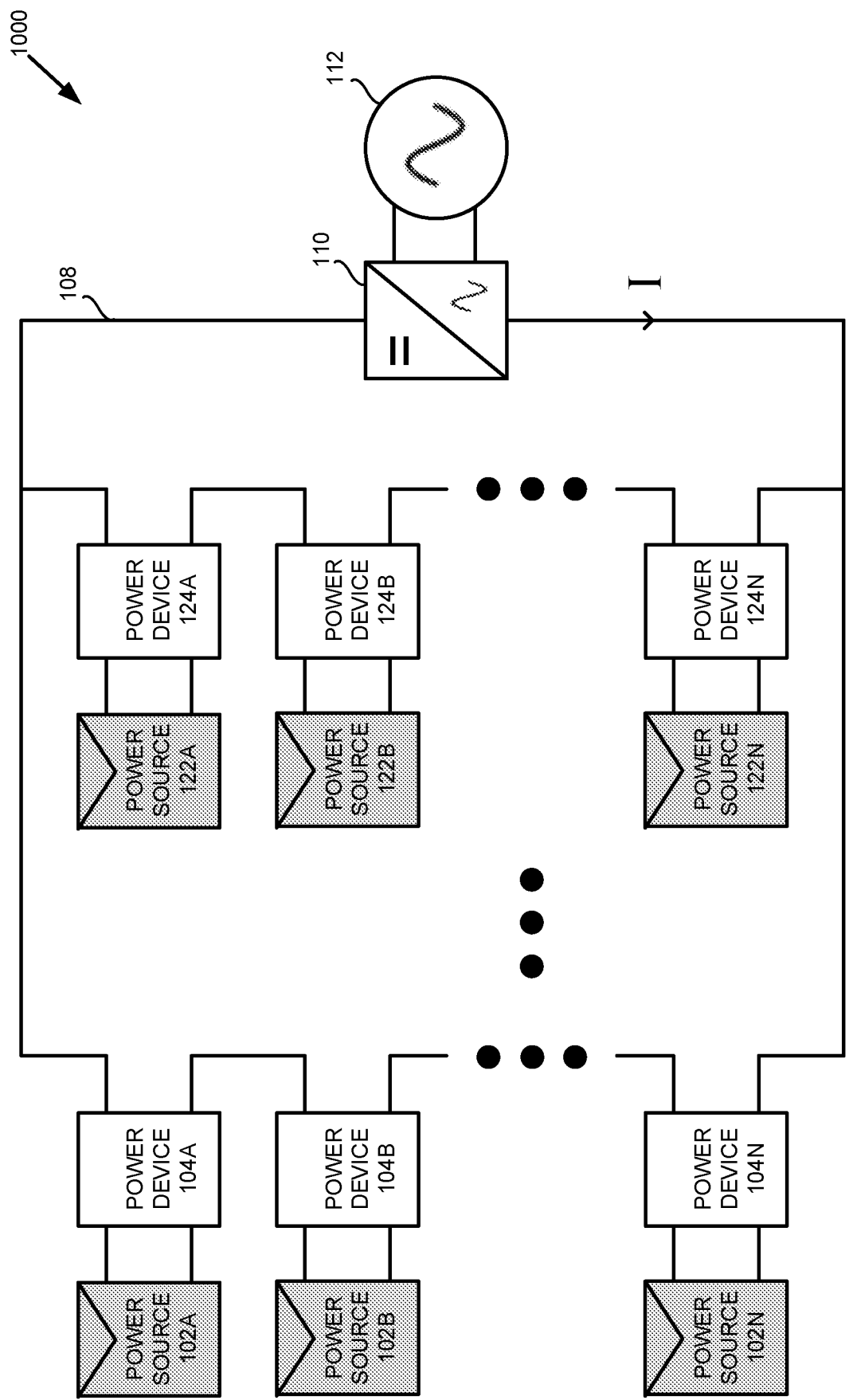
FIG. 10A illustrates a power system, in accordance with certain examples of the presently disclosed subject matter.

For example, as illustrated in FIG. 10A, in power system 1000 (which may be the same as or similar to power system 100), one or more power devices may be electrically connected to a power source, and one or more heating elements of a power device may be thermally coupled to a surface of the power source. For example, power device 104A is connected to (e.g., integrated into a junction box of) power source 102A, power device 104B is connected to power source 102B, . . . , power device 104N is connected to power source 102N, etc. And, heating element 204 (not depicted in FIG. 10A) of power device 104A is thermally coupled to a surface of power source 102A, heating element 204 of power device 104B is thermally coupled to a surface of power source 102B, . . . , heating element 204 of power device 104N is thermally coupled to a surface of power source 102N, etc.

In this case, system power device 110 may draw power from grid 112 and provide the power to the heating elements 204 of power devices 104, 124 in order to heat the surfaces of power sources 102, 122, to remove the snow obstructing the operation of the power sources 102, 122. Clearing the surface of a power source 102, 122 enables the power source 102, 122 (e.g. PV module) to produce power on its own. In this case, when in snow melting mode, the current I from the system power device 110 may flow in the same direction as if the power sources 102, 122 were producing power, and as if the power devices 104, 124 were not operating in a snow melting mode of operation. Current I may flow through the power devices 104, 124 which produce heat using one or more heating elements 204, similar to the way heat would be produced when operating in a bypass mode of operation where the power devices 104,124 convert power produced by the power sources 102, 122 (as opposed to power provided from an external power source, e.g., the grid or a storage device, described below with reference to FIG. 17) and the particular power device is being bypassed using a bypass diode (which may also be configured to be the heating element 204 in a snow melting mode of operation). In some cases, the voltage supplied by the external power source may be a reverse voltage (i.e., a voltage that has an opposite polarity than the voltage generated by the power source). In such cases, even though the voltage provided by the external power source is a reverse voltage, the current in the power device/heating element may flow in the same direction as when the power source is generating power not in the snow melting mode of operation (i.e., when the inverter/grid is operating as a load receiving power from the power source/power device, and not when the inverter/grid is operating as a power supply providing power to the power device/heating element, in both cases the current may be in the same direction).

Figure 10B:
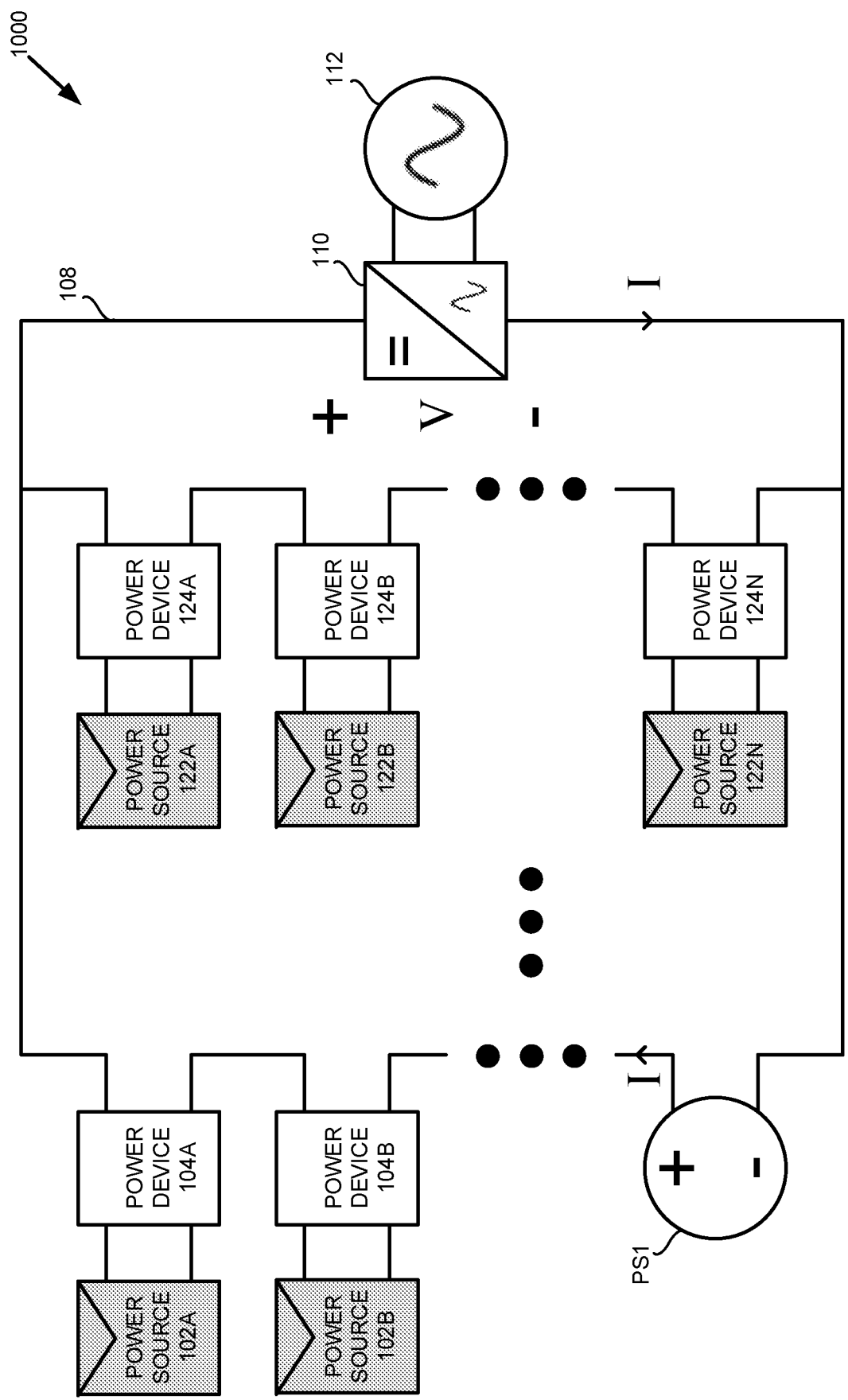
FIG. 10B illustrates a power system, in accordance with certain examples of the presently disclosed subject matter.
Figure 10C:
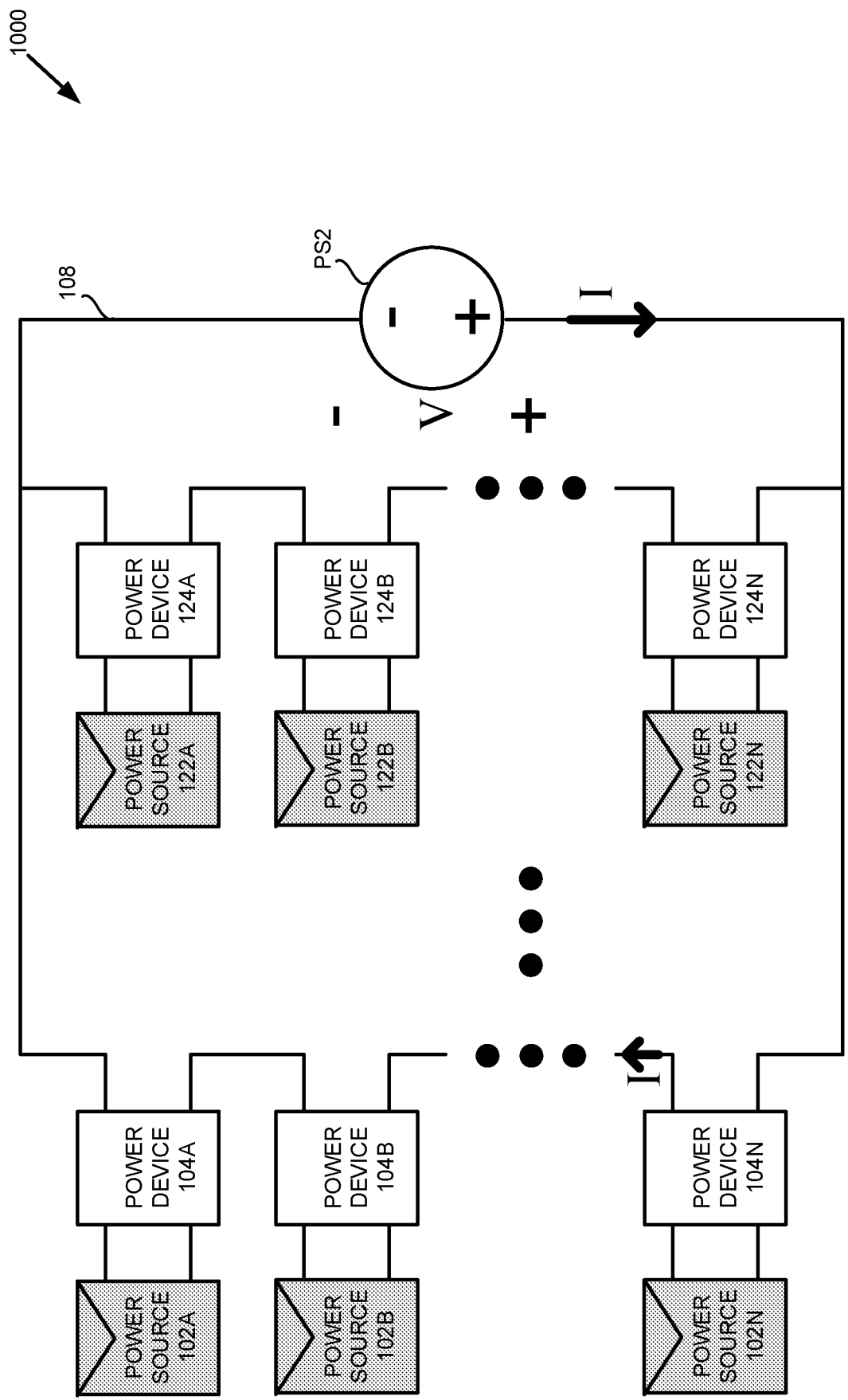
FIG. 10C illustrates a power system, in accordance with certain examples of the presently disclosed subject matter.

For example, take a case where the external power is provided by a system power device 110 connected to the grid 112, and where system power device 110 is an inverter. In this case, when one or more of the power sources 102 is producing power and the inverter is operating as a load receiving power, then the voltage on the DC side of the inverter is a positive voltage, and the current I flows in the direction of the arrow illustrated in FIG. 10A. See FIG. 10B, where the power source 102 (and power device 104) producing power is represented as a voltage source PS1. When in snow melting mode, the inverter might no longer operate as a load, e.g. if none of the power sources 102, 122 are producing power. Rather, when in snow melting mode, the inverter might operate as/similar to a power source providing a source of external power to one or more heating elements 204 of power devices 104,124 in order to clear the surface(s) of one or more power sources 102, 122 of snow. See FIG. 10C, where the inverter (and grid 112) producing power is represented as a voltage source PS2. In this case, the polarity of the voltage on the DC side of the inverter may be opposite to the polarity of the voltage on the DC side of the inverter when it was acting as a load (in the previous case, as illustrated in FIG. 10B as voltage V). Meaning, the voltage on the DC side of the inverter may be a negative voltage. However, this "negative voltage source" PS2 creates a voltage potential that is the same polarity as if one of the power sources 102, 122 were producing power/acting as a voltage source PS1. Therefore, in this case also, the current I may flow in the direction illustrated in FIG. 10A.

As an example, system power device 100 may have at least two terminals on a first side of the system power device 100. For example, in the case that system power device 100 may be a DC to AC inverter, system power device 100 may have two terminals on the DC side of the inverter, including a first terminal and a second terminal. When system power device 100 is operating in a PV power conversion mode of operation, the two terminals on the DC side of the inverter may be considered input terminals that provide an input voltage to the inverter. In this case, the electrical potential may be greater at the first terminal than at the second terminal (i.e. there is a "positive" voltage). On the other hand, when system power device 100 is operating in a snow melting mode of operation, the two terminals on the DC side of the inverter may be considered may be considered output terminals that provide an output voltage from the inverter. In this case, the electrical potential may be greater at the second terminal than at the first terminal (i.e. there is a "negative" voltage).

Returning to the discussion of FIG. 9, at step 906, a determination may be made whether or not the surface of a particular power source has been cleared completely or has been cleared enough to produce sufficient power on its own. As an example, the determination may be made using one or more controllers implementing method 900, e.g., in the power device and/or inverter. The determination may be based on and/or in response to parameter data obtained by one or more sensors. For example, the determination may be based on and/or in response to certain temperature parameter data, and/or certain electrical parameter data. The temperature parameter data and/or electrical parameter data may indicate that the power source is able to produce or is producing power greater than a particular threshold. For example, if one or more obtained time parameters indicate that it is daytime, or an internal clock so indicates, and one or more electrical parameters indicate that current is being produced by the panel above a minimal amount, then the panel may be considered as 'working'.

If the determination is that the surface has not been sufficiently cleared, then heat may be continued to be applied to the surface of the power source using a different/another external power source in order to melt snow and clear the surface of the power source (step 904). For example, the heating element may be the heating element of a power device thermally coupled to/in heating proximity of a surface of the power source, as described above. The step of determining whether or not the surface of a particular power device has been cleared (step 906) may be performed again at a later time. For example, the step of determining may be performed again based on and/or in response to the passage of a certain interval of time, and/or based on and/or in response to one or more sensed conditions. As an example, the determination may be triggered based on and/or in response to certain temperature parameter data, and/or certain electrical parameter data being obtained.

If the determination is that the surface has been sufficiently cleared, then the process may end or optionally proceed to step 908.

At step 908, a determination may be made whether or not the surfaces of all of the power devices in the power system have been cleared completely/enough to produce sufficient power on their own. As an example, the determination may be made using one or more controllers, e.g., in the power devices and/or inverter. The determination may be based on and/or in response to parameter data obtained by one or more sensors. For example, the determination may be based on and/or in response to certain temperature parameter data, and/or certain electrical parameter data. The temperature parameter data and/or electrical parameter data may indicate that the power sources are able to produce/are producing power greater than a particular threshold.

If the determination is that the all of the surfaces have been sufficiently cleared, then the power devices might no longer operate in a snow melting mode. The determination whether one or more of the power devices should subsequently operate in a snow melting mode may be made again at another time (step 902). For example, the step of determining may be performed again based on and/or in response to the passage of a certain interval of time, and/or based on and/or in response to one or more sensed conditions. As an example, the determination may be triggered based on and/or in response to certain temperature parameter data, and/or certain electrical parameter data being obtained. As an example, if the power devices no longer operate in a snow melting mode of operation, they may operate in a PV power conversion mode of operation where they are configured to convert power provided by the power source, which is able to produce power after being cleared.

If the determination is that not all of the surfaces have been sufficiently cleared, then the process proceeds to step 910.

At step 910 one or more power sources whose surfaces have been cleared of snow enough that they are able to produce their own power are used to provide power to heating elements of one or more other power devices.

Figure 11:
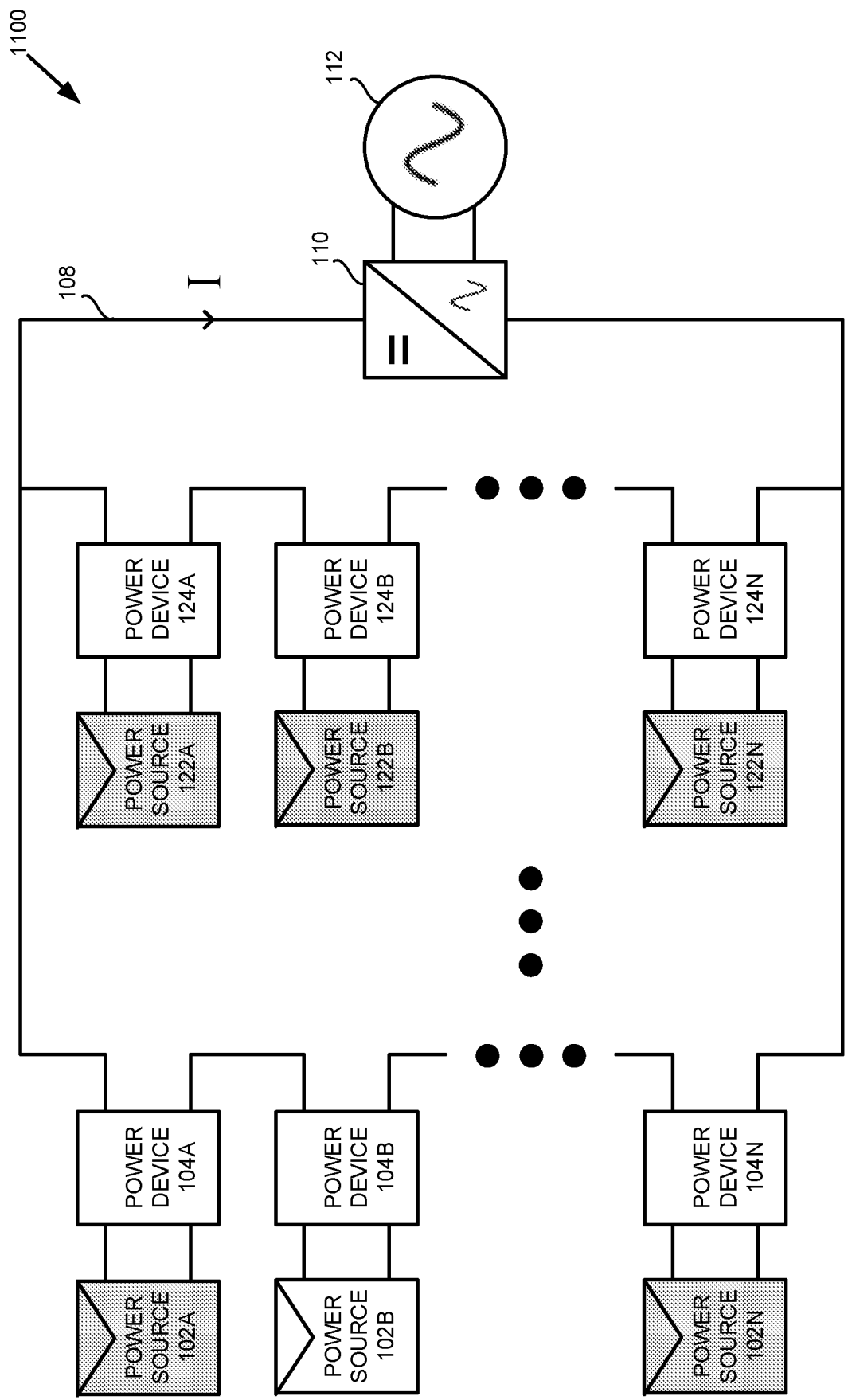
FIG. 11 illustrates a power system, in accordance with certain examples of the presently disclosed subject matter.

For example, with reference to FIG. 11, in power system 1100 (which may be the same as or similar to power systems 100, 1000) the outer surfaces of power sources 102A, 102N, and 122, are covered with snow to the extent that theses power sources 102A, 102N, and 122 are unable to produce sufficient power. However, the surface of power source 102B has been sufficiently cleared of snow using the heating element 204 (not depicted in FIG. 11) of power device 104B. This enables power source 102B to produce sufficient power, e.g. greater than a particular threshold. Heating element 204 of power device 104B might no longer be needed to melt snow on the surface of power source 102B, and heating element 204 of power device 104B might no longer be active (i.e., bypass of the power device might no longer be necessary since the power source may be able to produce sufficient power on its own since the surface of the PV module is no longer blocked by the snow and it is exposed to sunlight). The power produced by power source 102B may contribute to the powering of heating elements 204 in the other power sources 102A, 102N in order to help melt the snow covering their surfaces.

In such cases, the previously active external power source might no longer be needed to provide auxiliary power to power the heating element 204 of power device 104B, since power source 102B is able to provide sufficient power to operate other power devices in their snow melting mode of operation. As an example, once one or more power sources are cleared and able to provide power to other power devices in their snow melting mode, then the previously active external power source may be bypassed/turned off/disconnected, e.g., until all of the surfaces of the power sources have been cleared. For example, the auxiliary power provided from the previously active external power source, e.g. the grid and inverter, might not be needed to operate one or more power devices in snow melting mode when one or more power sources have been cleared of snow. In such a case, the subsequently active external power source powering the other power devices in snow melting mode may be the one or more cleared power sources. In some cases, both the previously active external power source (e.g. the grid) and the subsequently active external power source (e.g. one or more cleared PV modules) may be used at the same time to provide power to one or more power devices operating in a snow melting mode together. In some cases, once one or more power sources have been cleared and are operating as external power sources, then the grid/inverter may switch from being an external power source to becoming a load which receives power from the one or more power sources.

It will be appreciated that, according to examples of the present subject matter, one or more heating elements 204 are part of one or more power devices 104, 124.

It will also be appreciated that, according to examples of the present subject matter, one or more cleared PV modules may be used to help clear one or more other PV modules.

In some examples, one or more power sources, e.g. PV modules, are configured to produce heat sufficient to melt snow. In these cases, since PV modules may have properties similar to a diode, the PV power sources themselves may be the heating element 204, and/or help other heating elements. For example, referring back to FIG. 4A, when the converter 202 is a buck converter and the power source 102, 122 is provided with the voltage V1 and a reverse current is induced through power source 102, 122, then power source 102, 122 may operate as a heating element 204.

In some examples, one or more converters may be configured to induce current through a plurality of PV cells in a respective PV power source. In these cases, the PV power source may be configured to substantially evenly distribute the input current throughout the PV power source in order to substantially evenly heat a surface of the power source.

Figure 12:
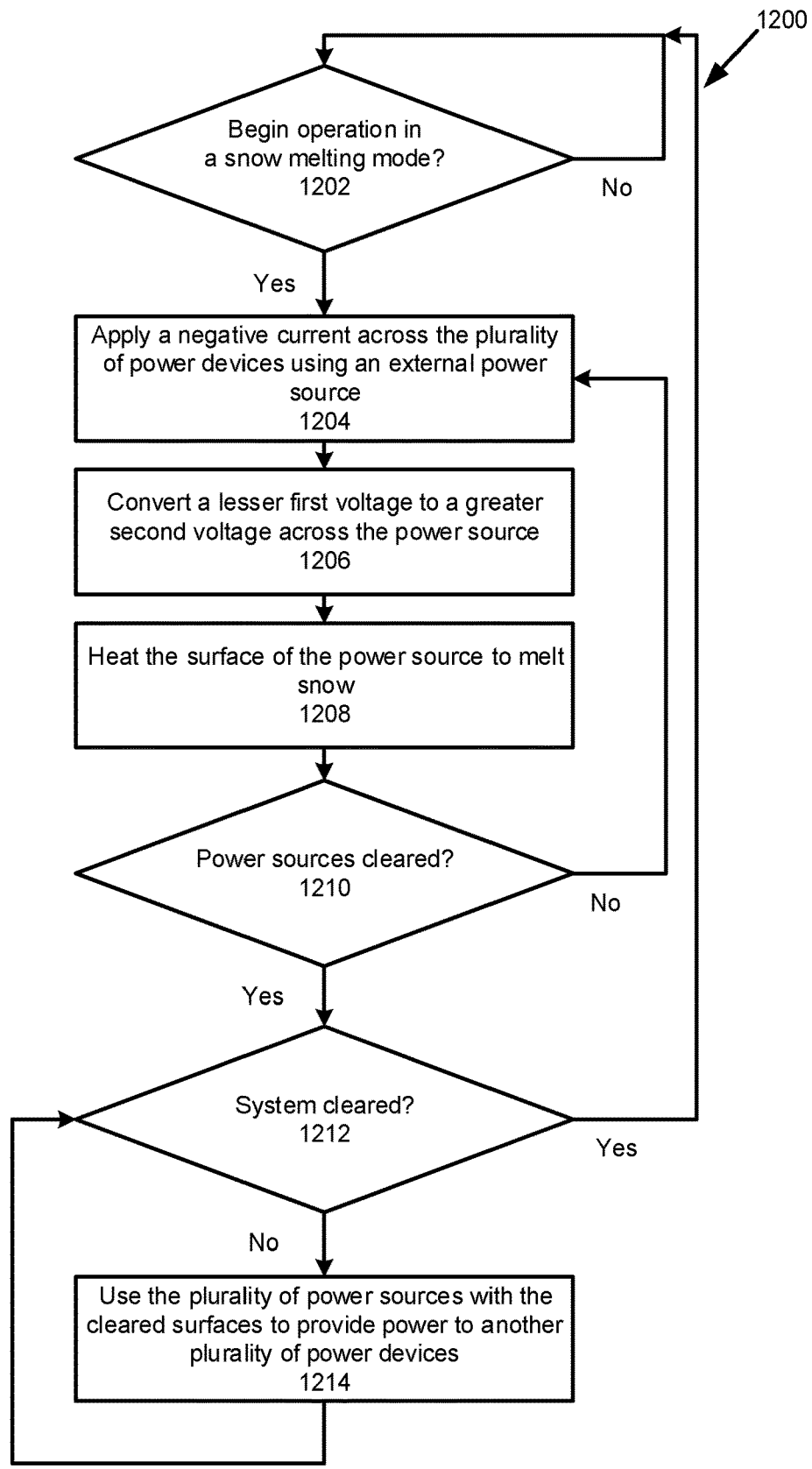
FIG. 12 illustrates a flow chart showing an example method for melting snow, in accordance with certain examples of the presently disclosed subject matter.

Reference is now made to FIG. 12, which illustrates a flow chart showing an example method 1200 for melting snow, in accordance with certain examples of the presently disclosed subject matter.

At step 1202, a determination may be made whether a power device should begin to operate in a snow melting mode. For example, the power device may have a plurality of modes of operation (e.g., standby mode, conversion in the direction from the power source to the inverter mode/PV power conversion mode, bypass mode, snow melting mode, etc.). An example of this determination will be described in greater detail below with reference to FIG. 16.

As an example, the determination whether the power device should begin to operate in the snow melting mode may be made using one or more controllers, e.g., in the power device and/or inverter. The determination may be based on and/or in response to parameter data, e.g. obtained by one or more sensors/controllers.

If the determination is that the power device should not begin to operate in a snow melting mode, then the step of determining may be performed again at a later time. For example, the step of determining may be performed again based on and/or in response to the passage of a certain interval of time, and/or based on and/or in response to one or more sensed conditions. As an example, the determination may be triggered based on and/or in response to certain temperature parameter data being obtained and/or electrical parameter data being obtained.

If the determination is to operate in the snow melting mode, then the process proceeds to step 1204. For example, with reference to FIG. 13A, which illustrates a power system 1300 (which may be the same as or similar to power system 100) in a situation where surfaces of all of the power sources 102, 122 are at least partially obscured by snow in a way that the power sources 102, 122 are unable to produce power at all or efficiently (e.g. greater than a particular threshold), then the power devices 104, 124 may be operated in a snow melting mode based on and/or in response to a determination to do so.

Returning to the discussion of FIG. 12, at step 1204, a negative current may be applied across the plurality of power devices using a different and/or another external power source. A negative current may be an electrical current that flows in an opposite direction than an electrical current that flows when the power source (e.g., 102, 122) is producing power in a power producing mode/power device is in PV power conversion mode. Negative current may also be referred to herein as a reverse current. As an example, power device 104, 124 may be configured to operate in a first mode of operation, e.g. a PV power conversion mode, where a current flows in a first direction from the power source to the power device 104, 124. In this example, power device 104, 124 may also be configured to operate in a second mode of operation, e.g. a snow melting mode of operation, where a negative current flows in a reverse direction and is induced from the power device 104, 124 through the power source in order to heat the power source and melt snow on a surface of the power source.

Figure 13A:
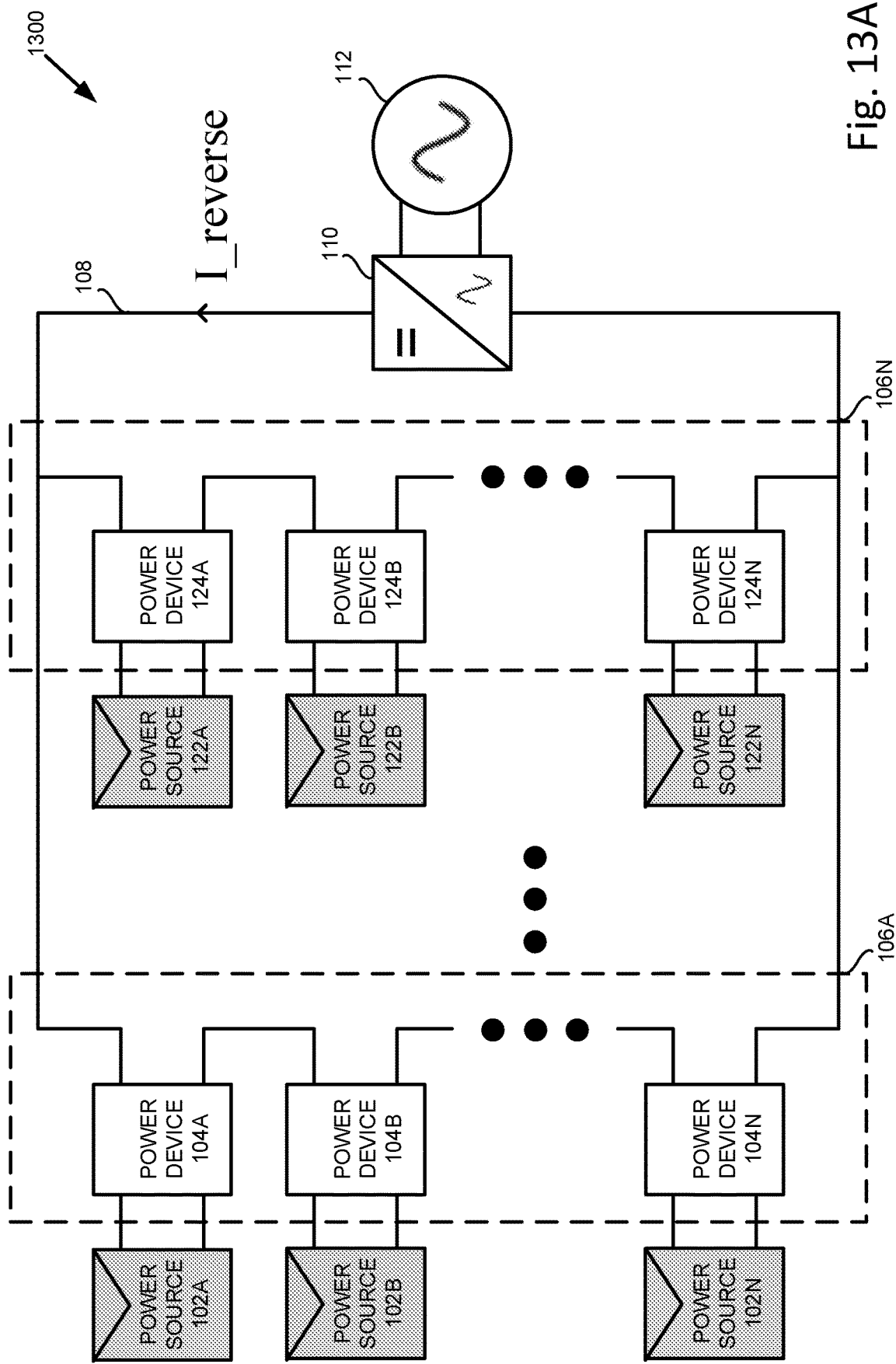
FIGS. 13A and 13B illustrate power systems, in accordance with certain examples of the presently disclosed subject matter.

For example, a plurality of power devices may be electrically connected to a plurality of power sources. For example, as illustrated in FIG. 13A, power device 104A is connected to power source 102A, power device 104B is connected to power source 102B, . . . , power device 104N is connected to power source 102N, etc. As an example, a plurality of power devices are also connected to each other. For example, power devices 104 may be connected in a series string connection 106A and power devices 124 may be connected in a series string connection 106N (see FIG. 1). Series string 106A and 106N may be connected in parallel to each other and in parallel to system power device 110. A first side of the system power device 110 is connected to the power devices 104, 124 and a second side of the system power device 110 is connected to the grid 112. For example, the first side of the system power device 110 may be opposite to the second side of the system power device 110 that is connected to the grid 112. The first side of the system power device 110 may be referred to as the DC side of the system power device 100, and the second side of the system power device 110 may be referred to as the AC side of the system power device 110.

In this case, system power device 110 may draw power from grid 112 and provide the power to series string 106A, 106N. The voltage value of the voltage across the first side of the system power device 110 connected to the power devices 104, 124 is divided between the power devices 104, 124 of a series string 106A, 106N. In this case, the current I_reverse from the system power device 110 flows in the opposite direction than if the power sources 102, 122 were producing power, and as if the power devices 104, 124 were not operating in a snow melting mode of operation. In this case, system power device 110 is a bi-directional inverter, and the current from the external power source is a reverse current I_reverse that flows in an opposite direction than the current I when the power source 102, 122 is producing power in a power producing mode/power device is in PV power conversion mode. According to this example, the system power device 110 may reverse the flow of current, and power device 104, 124 may induce the reverse current through the power source 102, 122/PV module. In some cases, when current is induced through the power source 102, 122/PV module, then the power source 102, 122/PV module acts/behaves with properties similar to a diode. The power source 102, 122/PV module may act/behave like a diode due to it being constructed, at least in part, from semiconductor material. As such, since the power source 102, 122 acts like a diode in the snow melting mode, then in these cases the power source 102, 122 itself is a heating element 204 for melting snow.

As an example, power source 102, 122 may be a PV Module and power device 104, 124 may be a buck converter which bucks the voltage from the PV module. When current is reversed, then the buck converter may act as a boost converter which boosts the voltage to the PV module and induces current to the PV module. Inducing current through the PV module may cause power/heat to be dissipated substantially evenly over the PV module's surface, since the current will flow through substantially the whole PV module. In this case, the system power device 110 may be used to generate and apply relatively low voltage on the power devices 104, 124 in order to change the power devices operation from: "buck power flow from PV module", to: "boost power flow to PV module". When the PV module is "full-shaded" it acts as a simple diode, and applying voltage greater than a particular threshold, e.g. greater than an open circuit voltage (Voc) may cause current to flow through each PV cell and heat up an entire surface of the PV module.

In some examples, the series string of power devices may be configured to balance the load/voltage across the string, and distribute the voltage substantially evenly among the power devices/power sources.

For example, if the voltage across a first side of the inverter, e.g. the DC side of the inverter, is about 80 V and string 106A has 10 PV modules, then the voltage on each PV module may be divided evenly to about 8 V per each power device 104. As another example, if the voltage across the DC side of the inverter is about 60 V and string 106A has 10 PV modules, then the voltage on each PV module 104 may be divided evenly to about 6 V per each power device 104. In this example, if string 106N has 12 PV modules, then the voltage on each PV module 124 may be divided evenly to about 5 V per each power device 124. This voltage applied on the PV modules may be used to heat and melt snow on a surface of the PV modules, as described below.

At step 1206, a lesser first voltage across the power device may be converted by the power device (e.g., by the boost mode of the buck+boost converter, or the boost direction of the bi-directional buck converter) to a greater second voltage across the power source. For example, a lesser first voltage across power device 104A may be converted to a second greater voltage across power source 102A.

Figure 20B:
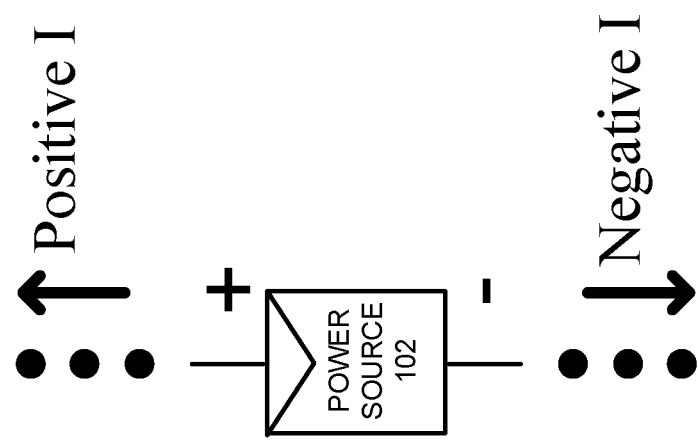
FIG. 20B illustrates a power source, in accordance with certain examples of the presently disclosed subject matter.
Figure 20A:
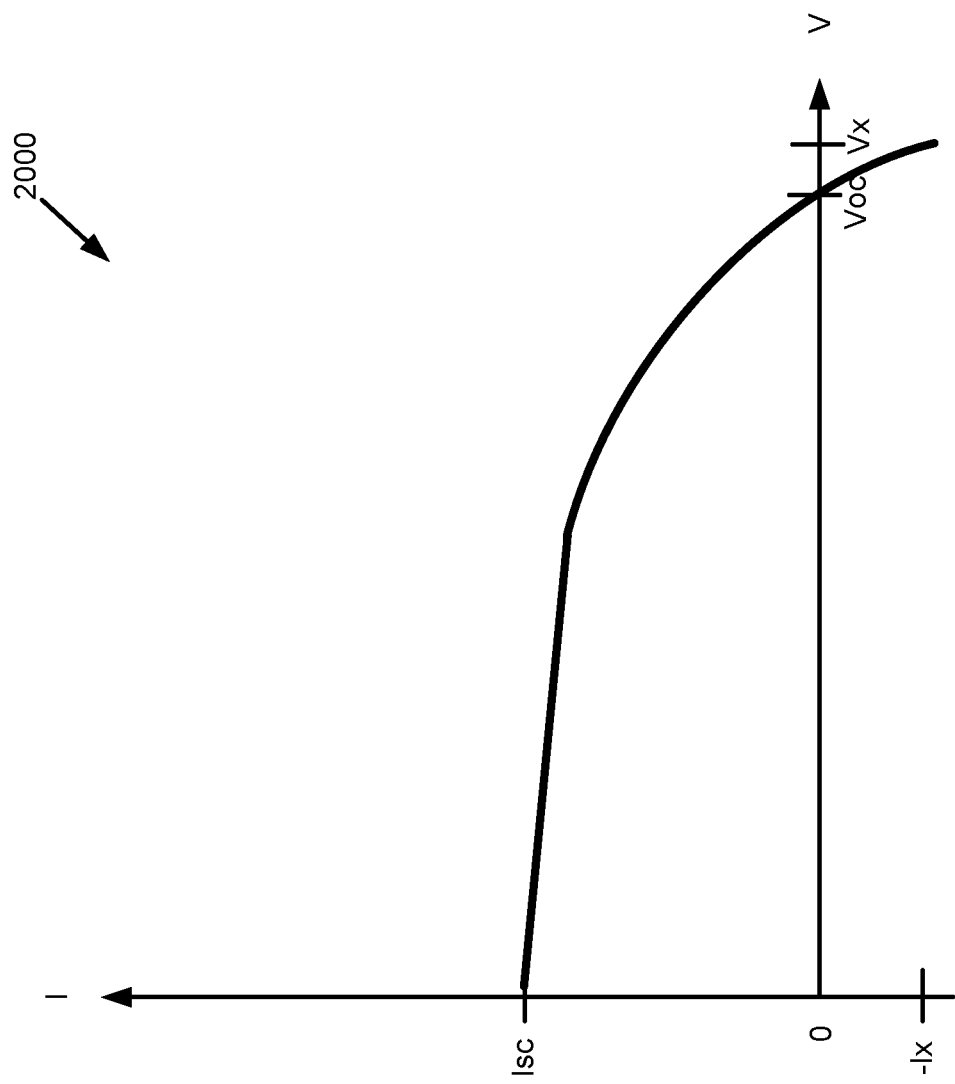
FIG. 20A illustrates a graph, in accordance with certain examples of the presently disclosed subject matter.

Reference is now made to FIGS. 20A and 20B. In FIG. 20A a graph 2000 of an I-V curve of a PV source/PV module is illustrated, in accordance with certain examples of the presently disclosed subject matter. In FIG. 20B, examples of possible directions of flow of electrical current through a power source/PV source is illustrated, in accordance with certain examples of the presently disclosed subject matter. As illustrated in FIG. 20A, when the current in the PV source is "short circuit" (I=Isc) then the voltage is about 0 V (V=0 V). Meaning, the PV source might not be producing voltage in such a case. When the PV source is producing voltage, if allowed to, the voltage of the PV source would generally increase up until a certain value until the value of electrical current through the PV source is about zero. This is the "open circuit voltage" (V=Voc; I=0 A). Typically PV sources are not operated at beyond this voltage value (V=Voc) since in general the goal of a power source is to provide power (i.e. voltage and current that are not equal to about zero, Power=Voltage×Current). However, in accordance with the present subject, the PV source may operate as a load (as opposed to a source), e.g., when the power system is operating in a snow melting mode of operation. In such a case, a voltage greater than Voc may be provided across the PV module. In such a case (V=Vx>Voc) a "negative" current may be induced in the PV module (I=Ix<0). As further illustrated in FIG. 20B, this "negative" current (Negative I) may be flowing in a direction that is opposite to the "positive" current (Positive I) which flows through the PV module, e.g., when the PV module is operating as a power source (i.e., the power system is operating in a PV power producing mode of operation, as opposed to the snow melting mode of operation).

Figure 13B:
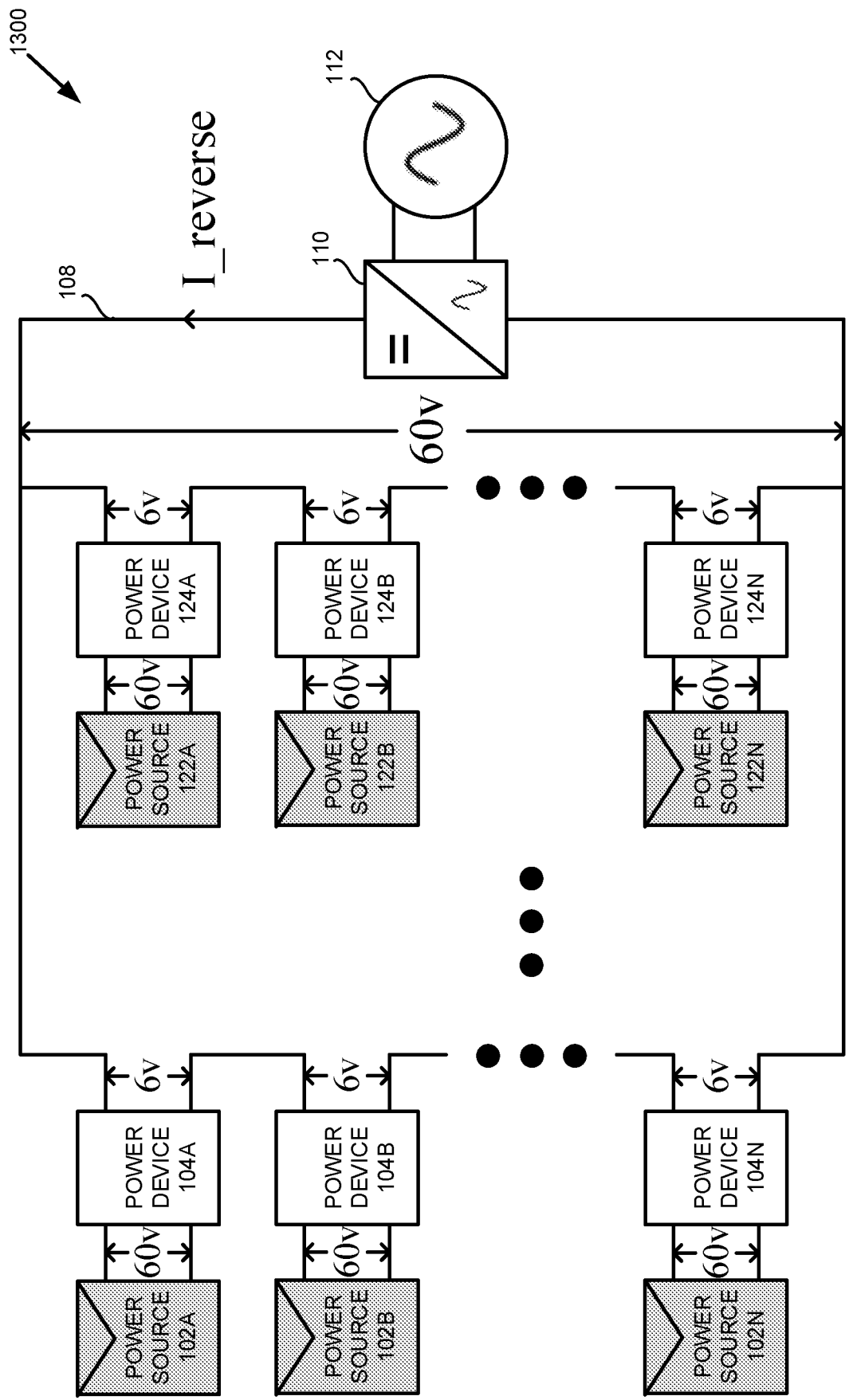

A non-limiting numerical example is now given with reference to FIG. 13B. As an example, if the voltage provided by system power device 110 is about 60 V, and there are 10 panels in a given string (e.g. string 106A) of power sources (e.g. power sources 102A, 102B, . . . , 102N) then about 6 V (60 V/10=6 V) are input to a given power device (e.g. power device 104A). Power device 104A may boost the input voltage, and output about 60 V across the associated power source (e.g. power source 102A.) In this example, the power device may operate in a mode of operation of power conversion in a direction from the grid to the power source, e.g., a snow melting mode. In snow melting mode, power device 104, 124 may act as a boost converter to boost a voltage input to power source 102, 122 (as opposed to when the power device operates in a mode of power conversion in a direction from the power source to the grid, e.g., PV source conversion mode, where power device 104, 124 acts as a buck converter to buck a voltage input from power source 102, 122).

Referring back to FIG. 12, at step 1208, the surface of the power source may be heated, and/or heat may be radiated in proximity to the surface of the power source/the ambient air around the surface of the power source in order to melt snow and clear the surface of the power source. For example, when the voltage across power sources 102, 122 is raised to the second greater voltage, then the current may flow through power sources 102, 122. Thus, the surfaces of power sources 102, 122 may heat up accordingly, and may thus remove snow obstructing the operation of the power sources 102, 122. As an example, as the reverse current flows through the power source 102, 122 (e.g. PV module) the power source 102, 122 acts like a diode, and heat may be substantially evenly distributed throughout the surface of the power source 102, 122 to melt snow on the surface of the power source 102, 122. For example, the at least one power device may be configured to induce the input current through a plurality of PV cells in the at least one PV power source. For example, the PV power source may be configured to substantially evenly distribute the input current throughout the PV power source, to substantially evenly heat a surface of the power source (relatively evenly distribute heat across the surface of the PV module). Clearing the surface of a power source enables the power source (e.g. PV module) to produce power on its own.

At step 1210, a determination may be made whether or not the surfaces of a plurality of power devices have been cleared completely/enough to produce sufficient power on their own. As an example, the determination may be made using one or more controllers, e.g., in the power device(s) and/or inverter. The determination may be based on and/or in response to parameter data obtained by one or more sensors. For example, the determination may be based on and/or in response to certain temperature parameter data, and/or certain electrical parameter data. The temperature parameter data and/or electrical parameter data may be indicative that the power source(s) are able to produce/are producing power greater than a particular threshold.

If the determination is that the surfaces have not been sufficiently cleared, then the surfaces of the power sources may continue to be heated using a different/another external power source in order to melt snow and clear the surface of the power sources (step 1204-step 1208). For example, in this case the heating element may be the power source itself, as described above. The step of determining (step 1210) may be performed again at a later time. For example, the step of determining may be performed again based on and/or in response to the passage of a certain interval of time, and/or based on and/or in response to one or more sensed conditions. As an example, the determination may be triggered based on and/or in response to certain temperature parameter data, and/or certain electrical parameter data being obtained.

If the determination is that the plurality of surfaces have been sufficiently cleared, then the process may end or optionally proceed to step 1212.

At step 1212 a determination may be made whether or not the surfaces of all of the power devices in the power system have been cleared completely/enough to produce sufficient power on their own. As an example, the determination may be made using one or more controllers, e.g., in the power devices and/or inverter. The determination may be based on and/or in response to parameter data obtained by one or more sensors. For example, the determination may be based on and/or in response to certain temperature parameter data, and/or certain electrical parameter data. The temperature parameter data and/or electrical parameter data may be indicative that the power sources are able to produce/are producing power greater than a particular threshold.

If the determination is that the all of the surfaces have been sufficiently cleared, then the power devices might no longer operate in a snow melting mode. The determination whether one or more of the power devices should subsequently operate in a snow melting mode may be made again at another time (step 1202). For example, the step of determining may be performed again based on and/or in response to the passage of a certain interval of time, and/or based on and/or in response to one or more sensed conditions. As an example, the determination may be triggered based on and/or in response to certain temperature parameter data, and/or certain electrical parameter data being obtained. As an example, if the power devices no longer operate in a snow melting mode of operation, they may operate in a PV power conversion mode of operation where they are configured to convert power provided by the power source, which is able to produce power after being cleared.

If the determination is that not all of the surfaces have been sufficiently cleared, then the process proceeds to step 1214.

At step 1214, one or more strings of power sources whose surfaces have been cleared of snow enough that they are able to produce their own power are used to provide power to heating elements of one or more other strings of power devices.

Figure 14:
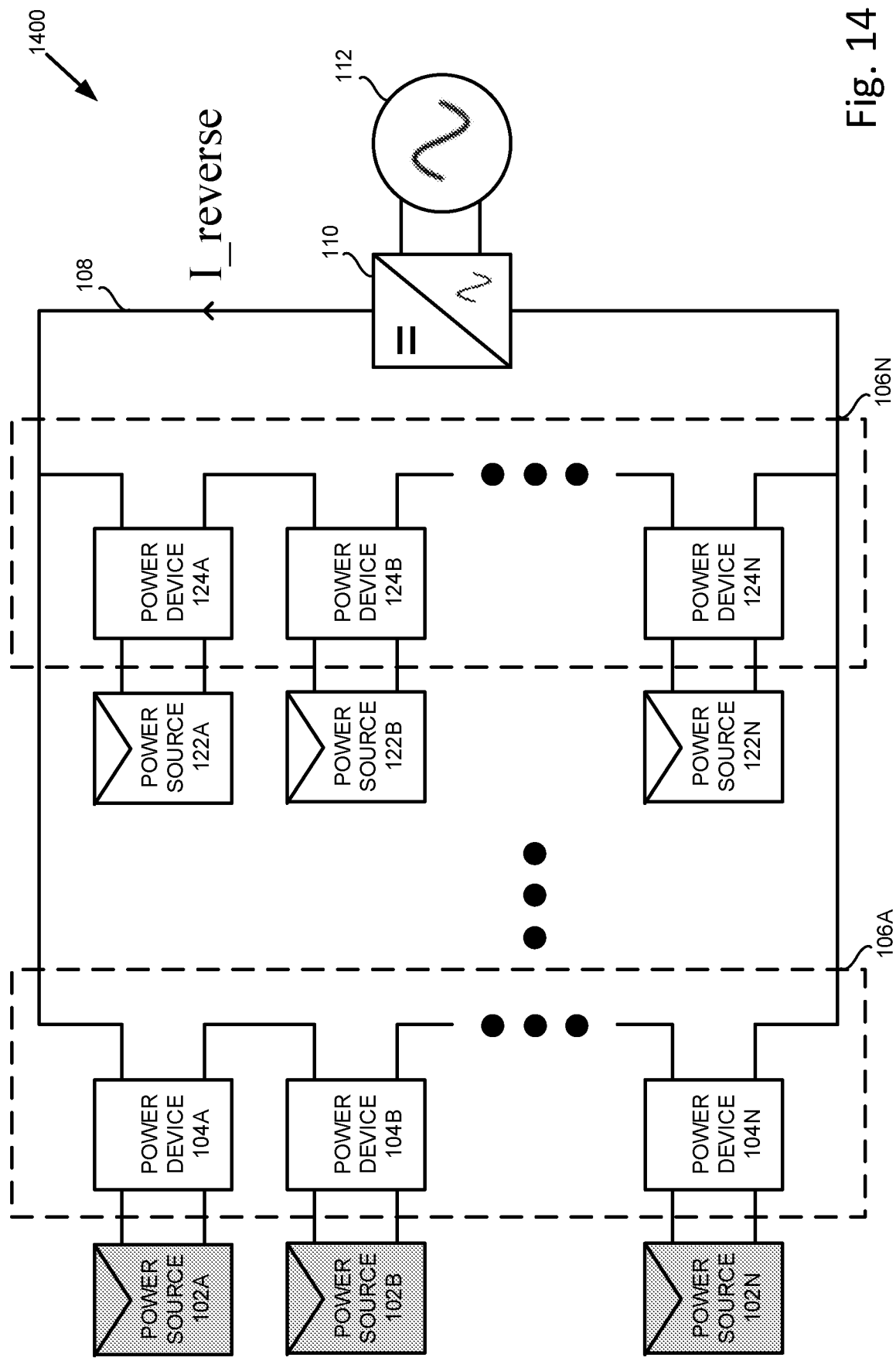
FIG. 14 illustrates a power system, in accordance with certain examples of the presently disclosed subject matter.

For example, with reference to FIG. 14, which illustrates a power system 1400 (which may be the same as or similar to power systems 100, 1200) the outer surfaces of power sources 102 of string 106A are covered with snow to the extent that theses power sources 102 are unable to produce sufficient power, e.g., greater than a particular threshold. However, the surfaces of power sources 122 of string 106N have been cleared of snow, e.g. using the greater second voltage output by power devices 124. Being clear of snow may enable each of the power sources 122 to produce sufficient power. The second greater voltage provided by the external power source might no longer be needed to melt snow on the surface of power sources 122, since power sources 122 are now able to produce sufficient power on their own. As an example, the external power source might no longer be active in this case. For example, the system power device 110/grid 112 may be electrically disconnected from the power sources at this point since they might no longer be necessary to help melt the snow. In this case, string 106N may be able to produce sufficient power on its own since the surfaces of the PV modules 122 are no longer blocked by the snow and they are exposed to sunlight. The power produced by power sources 122 of string 106N may be contributed to/provided across the other power sources 102 in string 106A, in order to help melt the snow covering their surfaces.

As mentioned above, in some examples, the inverter may be turned off/disconnected from the grid once it is no longer needed to help melt snow, e.g., one or more switches between the system power device 110 and grid 122 and/or bus 108 may be opened. In such cases, the external power source for clearing the remaining snow covered power sources may be the cleared panels, which are now producing power since they are cleared, instead of drawing power from the grid/inverter to melt the snow on the one or more strings of power sources/power devices.

As an example, the voltage produced by string 106N may be about 80 V, and this voltage may be provided across string 106A such that the voltage input to each of the 10 (by way of example) power devices 104 in string 106A is about 8 V. Each power device 104 may boost the lesser first voltage (i.e., 8V) and output a greater second voltage of about 80 V across its respective power source 102. This enables current to flow through the power source (in an opposite/reverse direction than when power source 102 is producing power) which causes power source 102 to act similar to a diode and heat up a surface of the power source 102 and melt snow on the surface of the power source, thereby clearing the surface of snow and allowing the power source 102 to produce power.

In some cases, both the previously active external power source (e.g. the grid) and the subsequently active external power source (e.g. the plurality of cleared PV modules) may be used at the same time to provide power to one or more power devices operating in a snow melting mode together. In some cases, a plurality of power sources have been cleared and are operating as an external power source to other pluralities of power devices, then the grid/inverter may switch from being an external power source to becoming a load which receives power from plurality of cleared power sources.

It will be appreciated that in some examples a relatively low voltage (a "safety voltage") may be used in snow melting mode in order to heat the power source. Using a relatively low voltage may be considered safer than using a relatively high voltage. For example, a relatively low current may be flowing through elements of the system, e.g. the power source and power device, when in a snow melting mode. In some cases, the voltage may be controlled based on the amount of heat that is desired to be generated by the heating element.

As an example, the voltage provided from the inverter to the plurality power devices may be a relatively low safety voltage, e.g., about a certain predetermined voltage, below a particular threshold voltage, within a particular range of voltages, etc. For example, the inverter safety voltage may be in the range of about 10s of volts. In some cases, the inverter safety voltage may be about 50V or about 80V.

For example, when the inverter is not producing power, input voltage may be maintained at the safety voltage value (e.g. about 10s of volts). This safety voltage value may be regulated by the inverter or by the power devices. Input voltage may refer to a voltage that is input to a power device.

As an example, the first lesser voltage across the power device may be a relatively very low safety voltage. For example, the power device safety voltage may be in the range of about less than 10 volts, for example: about 1V, about 2.5 V, about 6 V, about 8 V, etc.

It will also be appreciated that in some examples one or more strings of cleared PV modules may be used to help clear one or more other strings of PV modules.

In some examples if a string only has a single PV module, then a cleared PV module may be used to help clear one or more strings with a plurality of PV modules, and vice versa.

Reference is now made to FIG. 15, which illustrates a power system 1500 according to examples of the present subject matter. Power system 1500 may be the same as or similar to other power systems described in detail above. In FIG. 15, a plurality of sensors 1502, 1522, 1504, 1508 of power system 1500 are illustrated. FIG. 15 also illustrates a central controller 1506 external to the power devices 104, 124 and system power device 110. In some cases, one or more controllers may be included in power devices 104, 124 and system power device 110. As an example, the functionality of central controller 1506 may be included in one or more controllers included as part of power devices 104, 124 and system power device 110. For example, power devices 104, 124 may have a plurality of controllers and one or more of those controllers may be designated as a master controller which provides instructions to one or more other controllers. In some cases, central controller 1506 may be the master controller. In some examples, each power device may have its own controller with or without a central controller, and one or more of those controllers may be designated as a master controller.

The one or more controllers of power system 1500 may be configured to receive and/or transmit instructions as signals/indications/commands to and/or from one or more other elements of the power system. As mentioned above, one or more controllers may include one or more processors/processing circuits and memory configured to access data and make determinations/calculations/computations.

For the sake of simplicity, the connections between controller 1506 and power devices 104, 124 and/or sensors 1502, 1522, 1504, 1508 are not illustrated in FIG. 15. It will be appreciated that in some examples power devices 104, 124 and/or sensors 1502, 1522, 1504, 1508 may be communicatively and/or operably connected to one or more controller 1506. For example, sensors 1502, 1522, 1504, 1508 may provide data to controller 1506.

Sensors 1502, 1522, 1504, 1508 may be configured to obtain one or more parameter/parameter data related to power system 1500. This parameter may be a weather related parameter such as temperature or moisture. This parameter may be a light related parameter such as irradiance. This parameter may be a time related parameter such as hour, day, month, etc. This parameter may be an electrical parameter, for example: current, voltage, power, etc.

In some examples one or more sensors 1502, 1522, 1504, 1508 may be part of one or more power devices 104, 124 and/or system power device 110. For example, a time sensor may be a clock that is part of a power device 104, 124 and/or system power device 110.

In some examples, one or more controllers may be connected to a network, e.g. the Internet. The network/Internet may also function as a time server.

In some examples, one or more controllers may be used to balance the string voltage across a series string of power devices.

Figure 16:
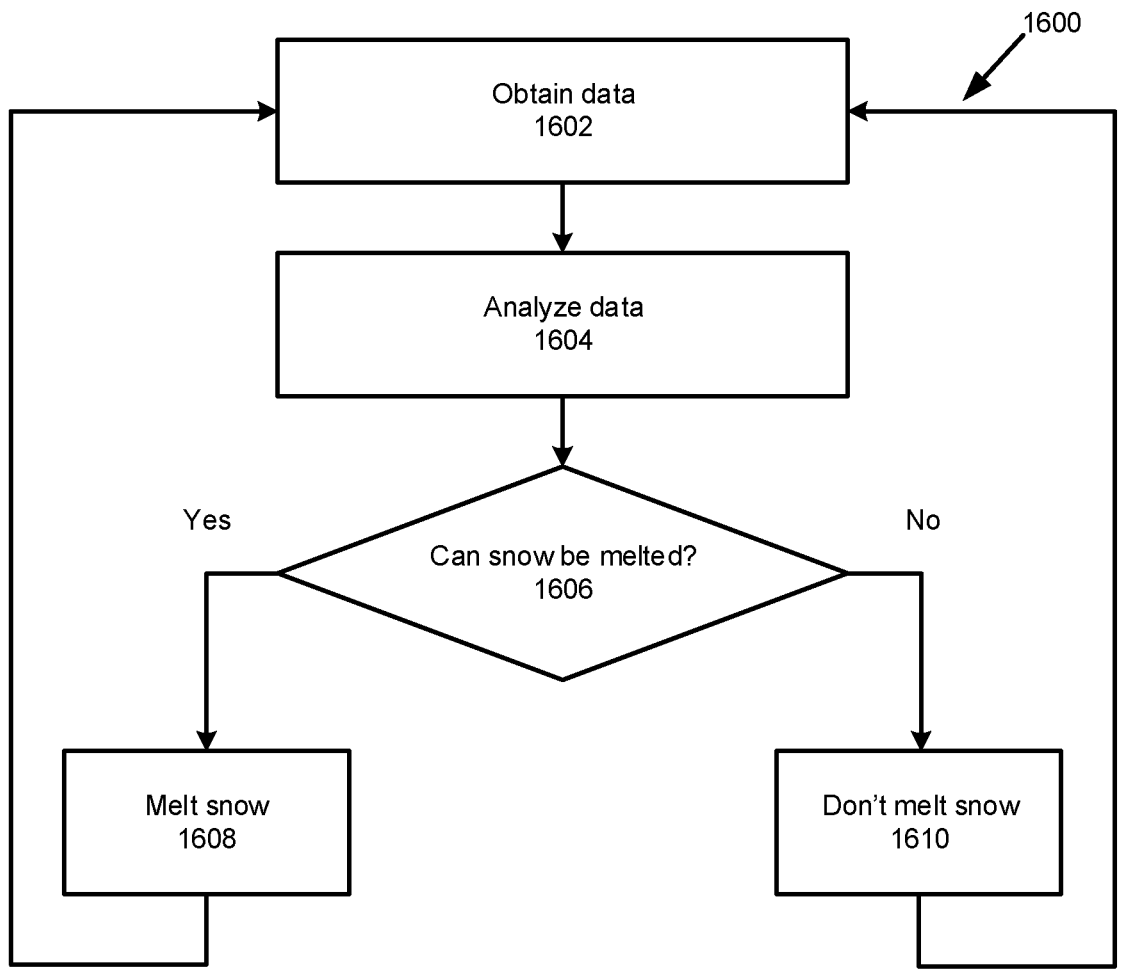
FIG. 16 illustrates a flow chart showing an example method for determining whether or not to melt snow, in accordance with certain examples of the presently disclosed subject matter.

Reference is now made to FIG. 16, which illustrates a flow chart showing an example method 1600 for determining whether or not to operate in a snow melting mode, in accordance with certain examples of the presently disclosed subject matter.

At step 1602, data related to the power system may be obtained. For example, this data may include weather data, time data, operational data, etc. This data may also include data related to a different power system. For example, this data may include statistical data related to a similar power system that operated in a snow melting mode in order to attempt to melt snow in weather conditions similar to those of the present power system. As an example, at least a portion of this data may be obtained by sensors 1502, 1522, 1504, 1508.

In some examples the power system/one or more controllers may be communicatively connected to other power systems/controllers. In some examples the power system/one or more controllers may be communicatively connected to a network, e.g. the Internet.

At step 1604, the obtained data may be analyzed. For example, the obtained data may be analyzed by one or more controllers 1506.

For example, the controllers and/or other devices on the network may be used to analyze data, such as weather data (e.g. is it currently snowing now), time data (e.g. is it daytime or night-time), temperature data (e.g. is too cold for snow melting mode), etc.

At step 1606, a determination may be made whether one or more power devices should operate in a snow melting mode. For example, this determination may be made by one or more controllers 1506 based on and/or in response to the analysis of the data obtained by one or more sensors 1502, 1522, 1504, 1508.

As an example, if the obtained data and analysis indicate that a temperature related to the power source is below a particular threshold and the capabilities of the heating element are such that the heating element will likely not produce sufficient heat in order to melt the snow and clear the panel, then the determination may be that the power system should not operate in a snow melting mode. For example, if the temperature data indicates that the temperature of the power source and/or the ambient temperature around the power source is less than about −40 degrees Fahrenheit/−40 degrees Celsius, then the determination may be to not operate in a snow melting mode, because it may be too cold to melt the snow, and even if it is attempted to heat the panel/ambient air up, it still might not warm up to greater than about 32 degrees Fahrenheit/0 degrees Celsius and thus might not be able to melt the snow (at all or efficiently enough).

As another example, if the obtained data and analysis indicate that a temperature related to the power source is greater than a particular threshold and the capabilities of the heating element are such that the heating element will likely produce sufficient heat in order to melt the snow and clear the panel, then the determination may be that the power system should operate in a snow melting mode, because it might not be too cold to melt the snow, and if the panel/ambient air is heated up, then it will likely warm up to greater than about 32 degrees Fahrenheit/0 degrees Celsius and will thus likely be able to melt the snow.

For example, if one or more obtained parameters relate to a temperature and the obtained temperature parameter data indicates that the temperature is greater than a particular threshold, then one or more controllers may be configured to control one or more power devices to provide an input current to the respective power source/heating element, i.e., if the temperature is greater than a particular threshold, then operate the power device to provide the input current to the power source/heating element.

As an example, the determination may also be time based (e.g., based on and/or in response to time data from a clock), and/or irradiance based (e.g., based on and/or in response to a determination that there is or is not sufficient sunlight). For example, if: the temperature is above a particular threshold, it is right time of day (daytime), the weather is within certain conditions and/or fits certain parameters (e.g., not a snowstorm), the external power source (e.g., a battery) is able to provide sufficient power, it is likely that the snow melting mode will be effective based on and/or in response to data indicative that a snow melting mode was effective on other strings in similar conditions/circumstances (statistical/probability/predictive/historical data may be obtained by one or more controllers, e.g. connected to a network, such as, the Internet), etc., then the decision may be made by the controller that conditions justify operation in snow melting mode.

If the determination is to operate in snow melting mode, then the method 1600 may proceed to step 1608. Examples of methods for operating the power system in a snow melting mode were described in detail above with reference to FIG. 9 and FIG. 12. As mentioned above, after operating in a snow melting mode, the method of determining whether to subsequently operate in a snow melting mode may be performed again at a later time. For example, the step of determining may be performed again based on and/or in response to the passage of a certain interval of time, and/or based on and/or in response to one or more sensed conditions. As an example, the determination may be triggered based on and/or in response to certain temperature data being obtained.

If the determination is to not operate in a snow melting mode, then the method 1600 may proceed to step 1610. For example, if the power system does not operate in a snow melting mode as a result of the determination, then the power system may enter or maintain a standby mode. Standby mode may have elements of the power system, such as one or more controller(s), operating at a reduced power level. In standby mode elements of the power system may continue to monitor and observe conditions related to the power system in order to later determine that a snow melting mode of operation is appropriate. After not operating in a snow melting mode, the method of determining whether to subsequently operate in a snow melting mode may be performed again at a later time.

Figure 17:
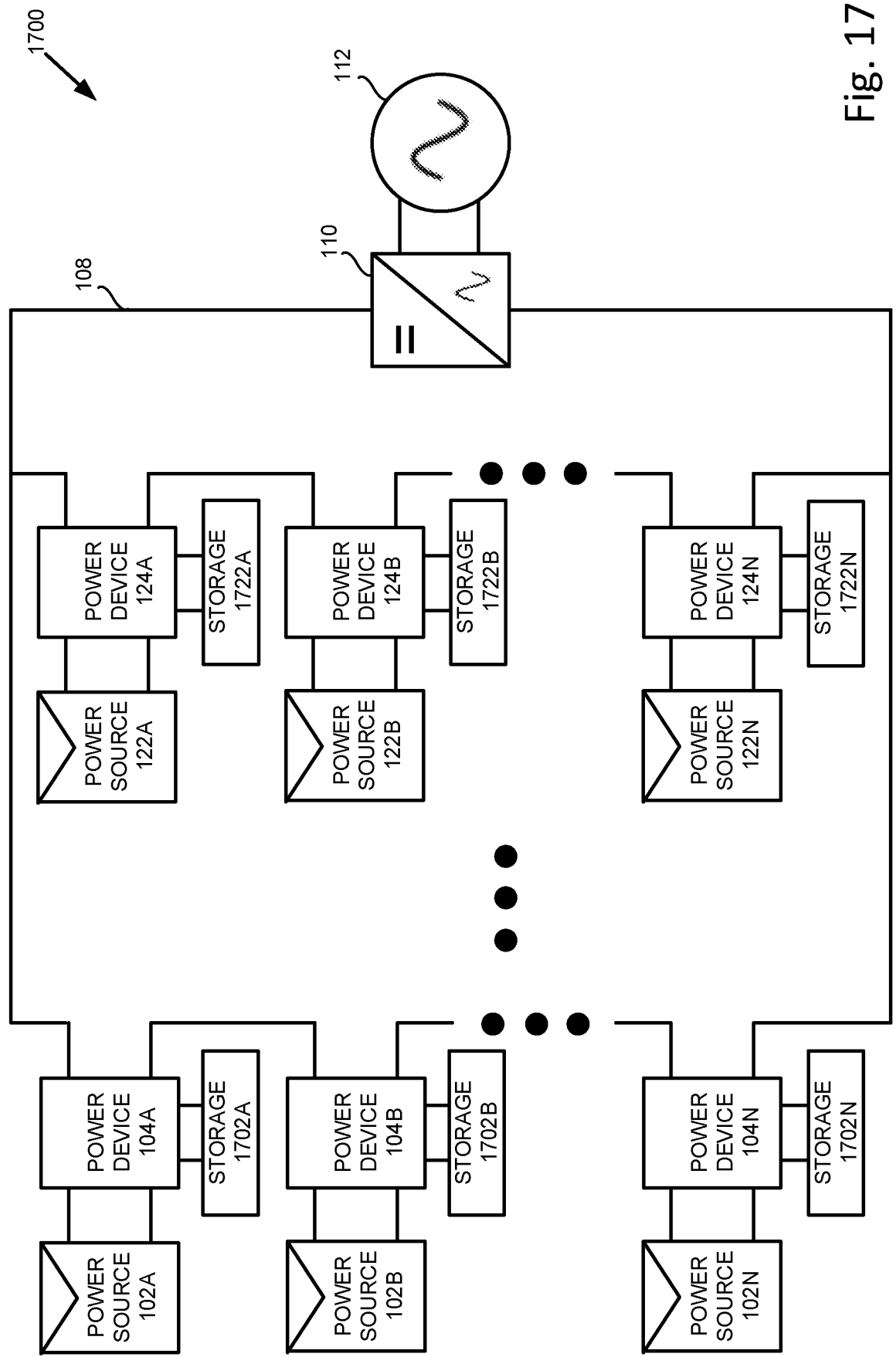
FIG. 17 illustrates a power system, in accordance with certain examples of the presently disclosed subject matter.

Reference is now made to FIG. 17, which illustrates a power system 1700 according to examples of the present subject matter. In FIG. 17, a plurality of storage devices 1702, 1722 of power system 1700 are illustrated. Storage devices may be configured to receive and provide electrical power. For example, storage device may be one or more battery, storage capacitor, flywheel, etc.

Each of storage device 1702 (e.g., 1702A, 1702B, . . . , 1702N), 1722 (e.g., 1722A, 1722B, . . . , 1722N) is electrically connected to a power device 104, 124. In some examples storage device 1702, 1722 may be configured to provide power to power device 104, 124 and/or heating element 204, e.g. auxiliary power when power device is in a standby mode of operation and/or a snow melting mode of operation. Storage device 1702, 1722 may be configured to be charged by power source 102, 122 and/or grid 112 (e.g. via power device 104, 124 and/or system power device 110). In some cases, storage device 1702, 1722 may be configured to provide power to grid 112 and/or one or more load (not shown). Charging/discharging of storage device 1702, 1722 may be controlled by one or more controllers of the power system 1700.

As mentioned above, in some examples, storage device 1702, 1722 may be configured to operate as a heating element 204. For example, storage device 1702, 1722 may be thermally coupled/in heating proximity to a surface of the power source 102, 122. In some cases, only some of the power devices 104, 124 may have an associated storage device 1702, 1722, while other power devices 104, 124 do not have an associated storage device 1702, 1722. In some cases, a plurality of power devices 104, 124 may be associated with one or more of the same storage device 1702, 1722. For example, power device 104A and power device 104B may be associated with the same storage device 1702X (not depicted).

Figure 18:
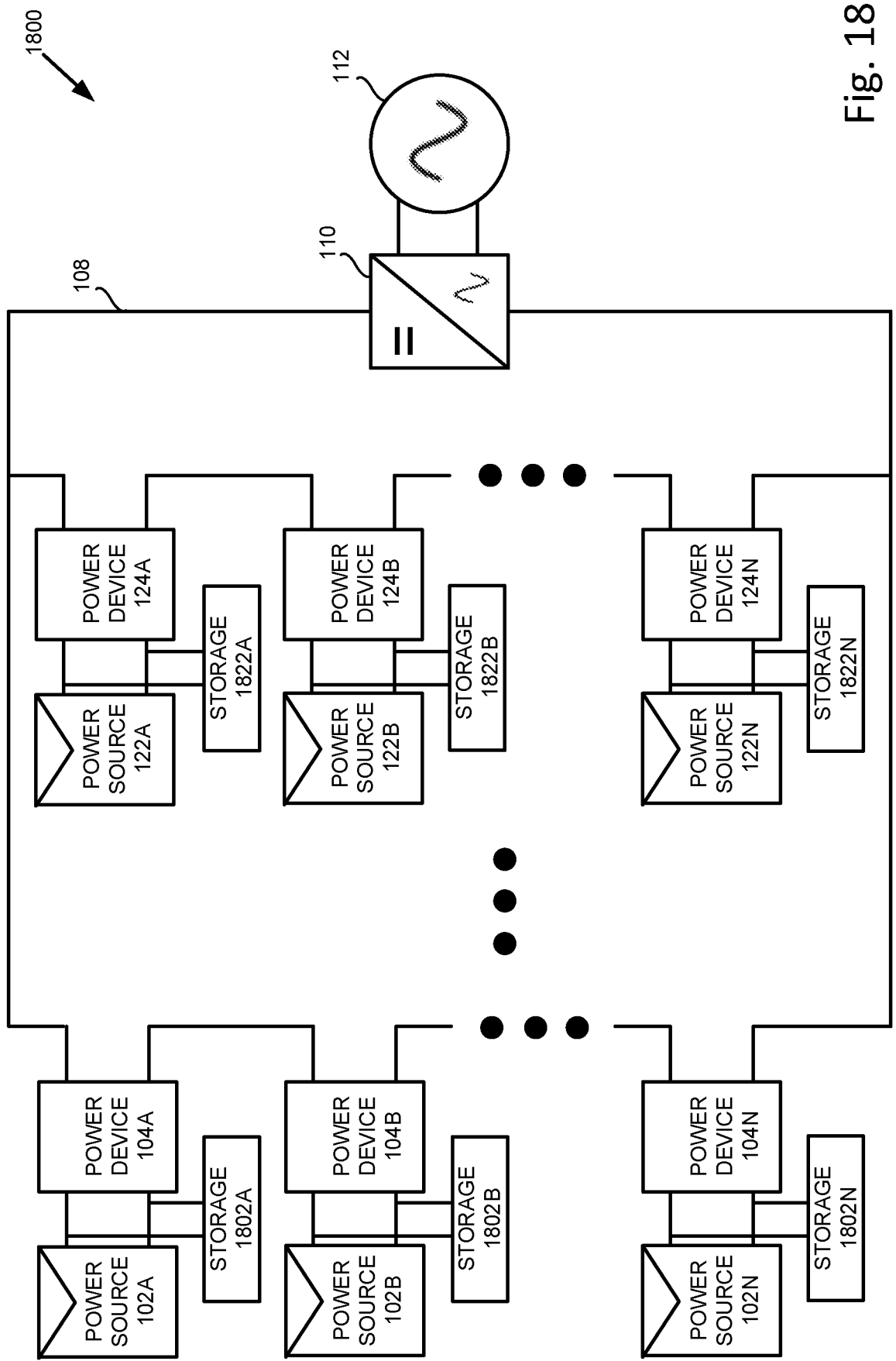
FIG. 18 illustrates a power system, in accordance with certain examples of the presently disclosed subject matter.

Reference is now made to FIG. 18, which illustrates a power system 1800 according to examples of the present subject matter. In FIG. 18 the plurality of storage devices 1802 (e.g., 1802A, 1802B, . . . , 1802N), 1822 (e.g., 1822A, 1822B, . . . , 1822N) of power system 1800 are illustrated as being electrically connected between the power source 102, 122 and the power device 104, 124. In this example, storage device 1802, 1822 may be in direct electrical contact with power source 102, 122 when charging from/discharging to the power source 102, 122. For example, storage device 1802, 1822 may be configured to discharge power to power source 102, 122 (e.g. in a case where power source is configured to operates as a heating element 204) when in a snow melting mode of operation.

Figure 19:
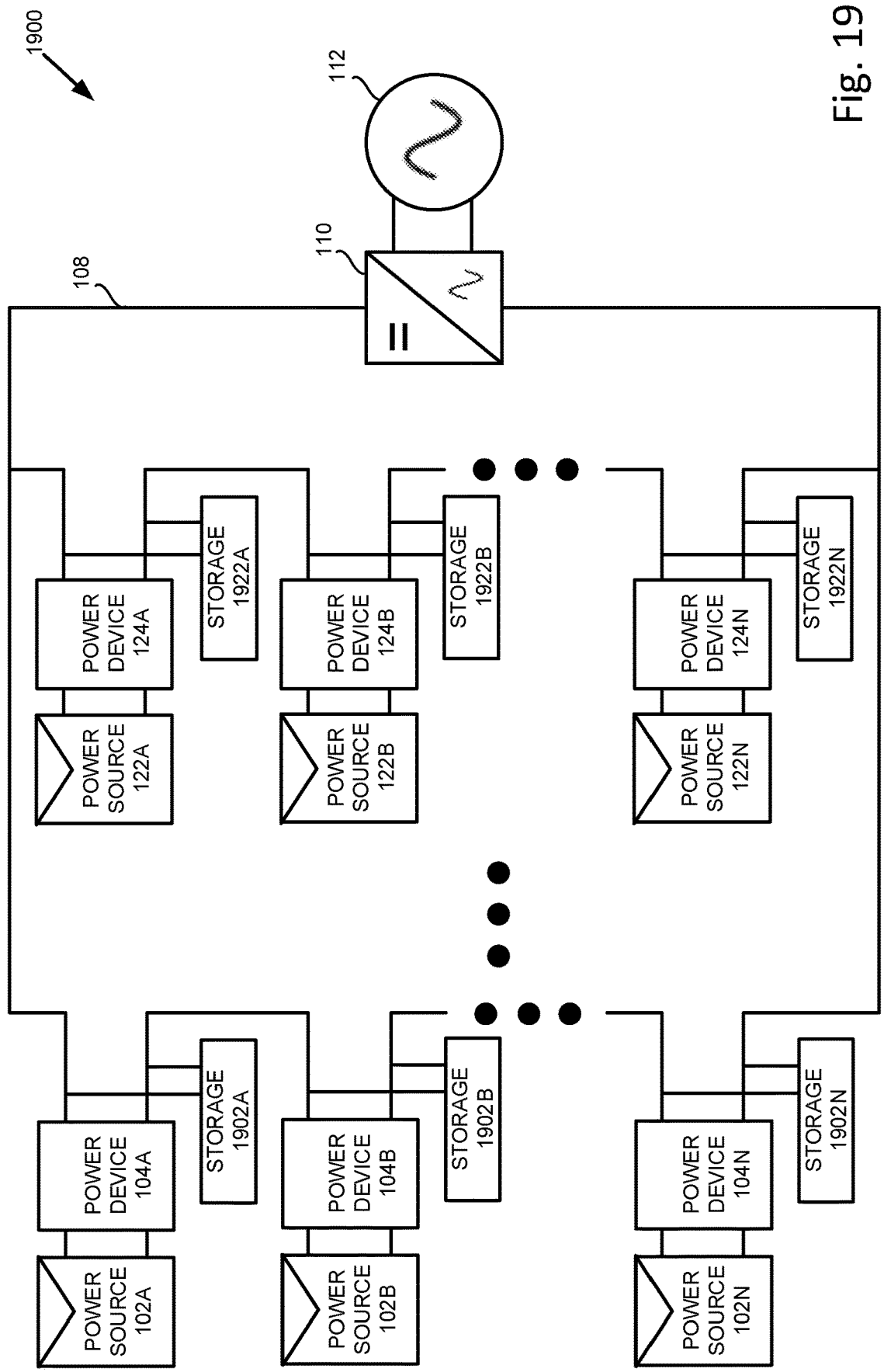
FIG. 19 illustrates a power system, in accordance with certain examples of the presently disclosed subject matter.

Reference is now made to FIG. 19, which illustrates a power system 1900 according to examples of the present subject matter. In FIG. 19 the plurality of storage devices 1902 (e.g., 1902A, 1902B, . . . , 1902N), 1922 (e.g., 1922A, 1922B, . . . , 1922N) of power system 1900 are illustrated as being electrically connected between the power device 104, 124 and the grid 112. In this example storage device 1902, 1922 is in electrical contact with power source 102, 122 via power device 104, 124 when charging from/discharging to the power source 102, 122. For example, storage device 1902, 1922 may be configured to discharge power to power device 104, 124/heating element 204 when in a snow melting mode of operation.

In some examples one or more storage devices may be configured to provide a reverse current to the power source/converter.

It should be appreciated that in general power storage devices are configured to provide power to loads that are not themselves power sources. However, in the present subject matter the power storage devices may be configured to provide power to one or more power sources when in a snow melting mode of operation.

Although examples are described above, features and/or steps of those examples may be combined, divided, omitted, rearranged, revised, and/or augmented in any desired manner. Various alterations, modifications, and improvements will readily occur to those skilled in the art. Such alterations, modifications, and improvements are intended to be part of this description, though not expressly stated herein, and are intended to be within the spirit and scope of the disclosure. Accordingly, the foregoing description is by way of example only, and is not limiting.

The skilled person will appreciate that inventive aspects disclosed herein include an apparatus, method or system as in any of the following clauses:

CLAUSES

Clause 1. An apparatus comprising: at least one power source; and at least one power device electrically connected to the at least one power source; wherein the at least one power device includes at least one heating element; and wherein the at least one heating element is thermally coupled to a surface of the at least one power source.

Clause 2. The apparatus of clause 1, wherein the at least one power source is a photovoltaic (PV) generator.

Clause 3. The apparatus of clause 1, wherein the at least one power device is a direct current (DC) to DC converter.

Clause 4. The apparatus of clause 1, wherein the at least one power device is a direct current (DC) to alternating current (AC) converter.

Clause 5. The apparatus of clause 1, wherein the at least one heating element is a diode.

Clause 6. The apparatus of clause 5, wherein the diode is a bypass diode.

Clause 7. The apparatus of clause 5, wherein the diode is a body diode of a bypass switch.

Clause 8. The apparatus of clause 1, wherein the at least one heating element is thermally coupled to an upper portion of the at least one power source.

Clause 9. The apparatus of clause 1, wherein: the at least one heating element is configured to be operated in response to: a current that flows in a same direction as if the current was produced by the at least one power source; and a voltage that has an opposite polarity as if the voltage was produced by the at least one power source.

Clause 10. The apparatus of clause 1, wherein the at least one heating element is electrically connected to at least one external power source.

Clause 11. The apparatus of clause 10, wherein the at least one external power source is an electrical grid.

Clause 12. The apparatus of clause 10, wherein: the at least one power device is a first power device; the at least one power source is a first power source; the at least one external power source is a second power source directly connected to a second power device; and the first power device is not directly connected to the second power source.

Clause 13. The apparatus of clause 10, wherein the at least one external power source is connected to an inverter.

Clause 14. The apparatus of clause 1, further comprising a plurality of power devices connected in series, and the plurality of power devices comprise the at least one power device.

Clause 15. The apparatus of clause 14, wherein the plurality of power devices is connected to an inverter.

Clause 16. An apparatus comprising: at least one power device configured to operate in a mode of operation in which the at least one power device provides an input current to at least one photovoltaic (PV) power source that is electrically connected to the at least one power device; wherein the at least one power device is connected to at least one external power source that is not the at least one PV power source.

Clause 17. The apparatus of clause 16, further comprising one or more sensors configured to determine one or more parameters related to the at least one PV power source.

Clause 18. The apparatus of clause 17, further comprising one or more controllers configured to control the at least one power device in response to the one or more parameters.

Clause 19. The apparatus of clause 18, wherein: the one or more parameters relate to a temperature; and the one or more controllers are configured to control the at least one power device to provide the input current if the temperature is greater than a threshold.

Clause 20. The apparatus of clause 16, wherein the at least one power device is a DC to DC converter.

Clause 21. The apparatus of clause 16, wherein the at least one power device is a buck converter.

Clause 22. The apparatus of clause 16, wherein the at least one power device is a buck+boost converter.

Clause 23. The apparatus of clause 16, wherein the at least one PV power source is a PV module.

Clause 24. The apparatus of clause 16, wherein the at least one power device is configured to induce the input current through a plurality of PV cells in the at least one PV power source.

Clause 25. The apparatus of clause 16, wherein the at least one power device is a bi-directional power device configured to either receive current from or provide current to the at least one PV power source.

Clause 26. The apparatus of clause 16, wherein the at least one power device is configured to be operated in the mode of operation in response to a current that flows in an opposite direction than if the current was produced by the at least one PV power source.

Clause 27. The apparatus of clause 16, wherein the at least one PV power source is configured to operate as a heating element that is configured to produce a heat to melt snow in response to the PV power source receiving the input current.

Clause 28. The apparatus of clause 16, wherein the at least one external power source comprises a plurality of PV power sources, and the plurality of PV power sources do not comprise the at least one PV power source.

Clause 29. The apparatus of clause 16, wherein the at least one external power source is an electrical grid.

Clause 30. The apparatus of clause 16, further comprising: a plurality of power devices connected in series to one another; wherein the plurality of power devices is connected to an inverter; and the at least one external power source is connected to the inverter.

Clause 31. An apparatus comprising: a plurality of photovoltaic (PV) power sources; and a plurality of power devices, each power device of the plurality of power devices being electrically connected to a respective PV power source of the plurality of PV power sources; wherein each power device of the plurality of power devices comprises a bi-directional converter, and each power device is configured to: operate in a first mode of operation where the bi-directional converter converts a lesser voltage provided across a first plurality of terminals of the bi-directional converter to a greater voltage across a second plurality of terminals across the respective PV power source to induce a current through the PV power source, the greater voltage having a value that is greater than the lesser voltage; and operate in a second mode of operation where the bi-directional converter converts power from the PV source across the second plurality of terminals and provides it across the first plurality of terminals of the bi-directional converter.

Clause 32. The apparatus of clause 31, wherein the first plurality of terminals comprise at least one terminal that is shared with at least one other bi-directional converter.

Clause 33. The apparatus of clause 31, wherein each PV power source of the plurality of power sources is configured to produce heat to melt snow when provided with the greater voltage.

Clause 34. The apparatus of clause 31, wherein each bi-directional converter is configured to either receive current from or provide current to the respective PV power source.

Clause 35. The apparatus of clause 31, wherein the plurality of power devices are DC to DC converters.

Clause 36. The apparatus of clause 31, wherein the plurality of power devices are DC to AC converters.

Clause 37. The apparatus of clause 31, wherein the plurality of bi-directional converters are buck converters.

Clause 38. The apparatus of clause 31, wherein the plurality of bi-directional converters are buck+boost converters.

Clause 39. The apparatus of clause 31, wherein each power device of the plurality of power devices is connected to at least one external power source.

Clause 40. The apparatus of clause 39, wherein the at least one external power source is an electrical grid.

Clause 41. The apparatus of clause 39, wherein: the plurality of power devices is a first plurality of power devices; the plurality of power sources is a first plurality of power sources; the at least one external power source is a second plurality of power sources, each power source of the second plurality of power sources being connected to a respective power device of a second plurality of power devices; and the second plurality of power devices is connected in parallel to the first plurality of power devices.

Clause 42. The apparatus of clause 39, wherein the at least one external power source is a storage device.

Clause 43. The apparatus of clause 39, wherein: the plurality of power devices is connected to an inverter; the external power source is connected to the inverter; and wherein the inverter is a bi-directional inverter.

Clause 44. The apparatus of clause 43, wherein a voltage provided from the inverter to the plurality power devices is below a threshold.

Clause 45. The apparatus of clause 43, wherein when the inverter is not producing power, an input voltage is maintained below a threshold.

Clause 46. The apparatus of clause 31, wherein the lesser voltage is below a threshold.

Clause 47. The apparatus of clause 31, wherein the plurality of power devices are connected in series.

Clause 48. The apparatus of clause 31, wherein the plurality of power devices are connected in parallel.

Clause 49. The apparatus of clause 31, wherein the plurality of power devices are connected in a combination of series and parallel connections.

Clause 50. The apparatus of clause 31, further comprising: one or more sensors configured to determine one or more parameters related to at least one PV power source from among the plurality of PV power sources; and one or more controllers configured to control at least one power device from among the plurality of power devices in response to the one or more parameters.

Clause 51. The apparatus of clause 50, wherein: the one or more parameters relate to a temperature; and if the temperature is greater than a temperature threshold, then the one or more controllers are configured to control the at least one power device so that the at least one power device provides an input current to the respective PV power source.

Clause 52. The apparatus of clause 31, wherein each bi-directional converter is configured to induce current through a plurality of PV cells in the respective PV power source.

Clause 53. A method comprising: connecting at least one power device comprising at least one heating element to at least one power source electrically; and coupling the at least one heating element of the power device to a surface of the at least one power source thermally.

Clause 54. A method comprising: coupling thermally a power device comprising a heating element to a power source; and heating a surface of the power source using the heating element in order to melt snow on the surface of the power source.

Clause 55. A method comprising: connecting each power device of a plurality of power devices to a respective power source of a plurality of power sources electrically; and converting, using each power device respectively, a lesser voltage to a greater voltage on the respective power source.

Clause 56. A method comprising: coupling each power device of a plurality of power devices to a respective power source of a plurality of power sources; applying a negative current to the plurality of power devices; amplifying a lesser voltage related to the negative current to a greater voltage; and heating the power source using the greater voltage to melt snow on the power device.

Clause 57. A method comprising: operating a heating element of a power device thermally coupled to a surface of a power source in a snow melting mode, wherein power is provided to the heating element by an external power source; and in response to the power source being operable to produce power greater than a threshold, powering one or more other heating elements of one or more other power devices using the power source.

Clause 58. A method comprising: operating a heating element that is thermally coupled to a power source and comprised in a power device in a snow melting mode in response to at least one parameter related to a surface of the power source, wherein power is provided to the heating element by an external power source; and in response to the power source being operable to produce power greater than a threshold, using the power source to provide power to one or more other heating elements of one or more other power devices.

Clause 59. A method comprising: applying a current to a first plurality of power devices, each power device of the first plurality of power devices being respectively connected to a respective power source of a first plurality of power sources; amplifying a lesser voltage related to the current to a greater voltage; heating at least one of the respective power sources using the greater voltage to melt snow on the power device; and in response to the first plurality of power sources being operable to produce power greater than a threshold, using the first plurality of power sources to provide power to a second plurality of power devices.

Clause 60. An apparatus comprising: at least one power device, the at least one power device comprising at least one heating element; and a housing for the at least one power device, the housing being configured to be coupled to at least one power source, and the housing comprising at least a portion of thermally conductive material arranged in the housing so that, when the housing is coupled to the at least one power source, the at least one heating element of the at least one power device is thermally coupled to a surface of the at least one power source.

The invention claimed is:
1. An apparatus comprising:
   first terminals configured to interface with a power source;
   second terminals configured to interface with a plurality of power devices; and
   circuitry configured to:
      in a power conversion mode of operation, convert voltage from the first terminals to the second terminals; and
      in a heating mode of operation, convert voltage from the second terminals to the first terminals;
      wherein the circuitry comprises a heating element configured to be in thermal proximity to a surface of the power source, and the heating element comprises a body diode.

2. The apparatus of claim 1, wherein, in the power conversion mode of operation, the circuitry is further configured to decrease higher voltage at the first terminals to lower voltage at the second terminals.

3. The apparatus of claim 2, wherein, in the power conversion mode of operation, the circuitry is further configured to convert current from the first terminals to the second terminals.

4. The apparatus of claim 1, wherein, in the heating mode of operation, the circuitry is further configured to increase lower voltage at the second terminals to higher voltage at the first terminals.

5. The apparatus of claim 4, wherein, in the heating mode of operation, the circuitry is further configured to convert current from the second terminals to the first terminals.

6. The apparatus of claim 1, wherein the circuitry comprises buck converter circuitry configured to step down voltage from the first terminals to the second terminals.

7. The apparatus of claim 1, wherein the circuitry comprises boost converter circuitry configured to step up voltage from the second terminals to the first terminals.

8. The apparatus of claim 1, wherein the heating element is a part of converter circuitry.

9. The apparatus of claim 1, wherein, in the heating mode of operation, the second terminals are configured to receive power from an external power source.

10. The apparatus of claim 9, wherein the external power source comprises an electrical grid.

11. The apparatus of claim 9, wherein the external power source comprises a second plurality of power devices connected to the plurality of power devices.

12. The apparatus of claim 11, wherein the second plurality of power devices is connected in parallel to the plurality of power devices.

13. The apparatus of claim 11, wherein each power device of the second plurality of power devices is connected to a respective power source of a plurality of power sources.

14. The apparatus of claim 13, wherein the plurality of power sources are photovoltaic (PV) modules.

15. The apparatus of claim 1, wherein the power source is comprises a photovoltaic (PV) module.

16. The apparatus of claim 1, wherein the circuitry is configured to:
   in a first mode of operation, transfer power from the first terminals to the second terminals; and
   in a second mode of operation, transfer power from the second terminals to the first terminals.

17. A system comprising:
   a plurality of power sources;
   a plurality of power devices, each of the plurality of power devices comprising:
      first terminals configured to interface with a respective power source of the plurality of power sources, and second terminals configured to interface with the plurality of power devices; and circuitry configured to:
in a power conversion mode of operation, convert voltage from the first terminals to the second terminals; and
in a heating mode of operation, convert voltage from the second terminals to the first terminals;
wherein the circuitry comprises a heating element configured to be in thermal proximity to a surface of the respective power source, and the heating element comprises a body diode.

18. The system of claim 17, wherein the circuitry is configured to:
in a first mode of operation, transfer power from the first terminals to the second terminals; and
in a second mode of operation, transfer power from the second terminals to the first terminals.

19. A method comprising:
converting, based on a power conversion operation mode of circuitry, voltage from first terminals of the circuitry to second terminals of the circuitry, wherein the first terminals are configured to interface with a power source and the second terminals are configured to interface with a plurality of power devices; and
converting, based on a heating operation mode of the circuitry, voltage from the second terminals of the circuitry to the first terminals of the circuitry;
wherein the circuitry comprises a heating element configured to be in thermal proximity to a surface of the power source, and the heating element comprises a body diode.

20. The method of claim 19, wherein the circuitry is configured to:
transfer power from the first terminals to the second terminals in the power conversion operation mode; and
transfer power from the second terminals to the first terminals in the heating operation mode.

* * * * *